(12) United States Patent
Oh et al.

(10) Patent No.: US 10,644,710 B2
(45) Date of Patent: May 5, 2020

(54) ELECTRONIC CIRCUIT FOR ADJUSTING PHASE OF CLOCK

(71) Applicant: Electronics and Telecommunications Research Institute, Daejeon (KR)

(72) Inventors: Kwang Il Oh, Daejeon (KR); Tae Wook Kang, Daejeon (KR); Sung Eun Kim, Daejeon (KR); Hyuk Kim, Daejeon (KR); Mi Jeong Park, Sejong-si (KR); Hyung-Il Park, Daejeon (KR); Kyung Jin Byun, Daejeon (KR); Jae-Jin Lee, Daejeon (KR); In Gi Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/542,469

(22) Filed: Aug. 16, 2019

(65) Prior Publication Data

US 2020/0067516 A1    Feb. 27, 2020

(30) Foreign Application Priority Data

Aug. 21, 2018   (KR) .......................... 10-2018-0097621
Dec. 20, 2018   (KR) .......................... 10-2018-0165972

(51) Int. Cl.
*H03L 7/08*       (2006.01)
*H03L 7/093*      (2006.01)

(52) U.S. Cl.
CPC ............... *H03L 7/093* (2013.01); *H03L 7/08* (2013.01)

(58) Field of Classification Search
USPC .................................. 327/147–149, 156–158
See application file for complete search history.

(56) References Cited

U.S. PATENT DOCUMENTS

| 5,233,636 A | 8/1993 | Lee et al. |
| 7,053,666 B2 | 5/2006 | Tak et al. |

(Continued)

FOREIGN PATENT DOCUMENTS

| KR | 1020100045126 A | 5/2010 |
| KR | 1020100120042 A | 11/2010 |

(Continued)

*Primary Examiner* — Adam D Houston
(74) *Attorney, Agent, or Firm* — Rabin & Berdo, P.C.

(57) ABSTRACT

The inventive concept includes an oscillating circuit, a phase inverting circuit, and a phase detecting circuit. The oscillating circuit generates a first clock to be used to sample an input signal. The phase inverting circuit outputs a second clock based on the first clock. The phase detecting circuit generates a control signal having a first logic value when a phase difference between a phase of the input signal and a phase of the second clock is less than a reference value for a reference time or more. The phase detecting circuit generates the control signal having a second logic value when the phase difference is equal to or greater than the reference value or when the phase difference is less than the reference value for a time shorter than the reference time. The phase inverting circuit inverts the phase of the second clock when a logic value of the control signal changes from the first logic value to the second logic value or when a logic value of the control signal changes from the second logic value to the first logic value.

17 Claims, 17 Drawing Sheets

(56) References Cited

U.S. PATENT DOCUMENTS

| | | | | |
|---|---|---|---|---|
| 8,866,522 | B1* | 10/2014 | Kim | H03L 7/0814 |
| | | | | 327/148 |
| 9,065,558 | B2 | 6/2015 | Song et al. | |
| 10,110,240 | B1* | 10/2018 | Satoh | H03L 7/193 |
| 2003/0197536 | A1* | 10/2003 | Issa | H03K 5/00006 |
| | | | | 327/158 |
| 2004/0217788 | A1* | 11/2004 | Kim | H03L 7/0814 |
| | | | | 327/158 |
| 2007/0216456 | A1* | 9/2007 | Kook | H03L 7/0812 |
| | | | | 327/158 |
| 2009/0134918 | A1* | 5/2009 | Tzeng | G01R 31/31709 |
| | | | | 327/106 |
| 2009/0146711 | A1* | 6/2009 | Senda | G09G 3/2096 |
| | | | | 327/158 |
| 2010/0164566 | A1* | 7/2010 | Ku | H03L 7/0812 |
| | | | | 327/149 |
| 2010/0289543 | A1* | 11/2010 | Wan | H03L 7/0805 |
| | | | | 327/158 |
| 2011/0234278 | A1* | 9/2011 | Seo | H03L 7/0814 |
| | | | | 327/158 |
| 2011/0248753 | A1* | 10/2011 | Leistner | H03L 7/085 |
| | | | | 327/156 |
| 2012/0112810 | A1* | 5/2012 | Wang | H03L 7/0814 |
| | | | | 327/158 |

FOREIGN PATENT DOCUMENTS

| | | | |
|---|---|---|---|
| KR | 101885033 | B1 | 8/2018 |
| KR | 101905097 | B1 | 10/2018 |

* cited by examiner

ELECTRONIC CIRCUIT FOR ADJUSTING PHASE OF CLOCK

CROSS-REFERENCE TO RELATED APPLICATIONS

This U.S. non-provisional patent application claims priority under 35 U.S.C. § 119 of Korean Patent Application Nos. 10-2018-0097621, filed on Aug. 21, 2018, and 10-2018-0165972, filed on Dec. 20, 2018, respectively, the entire contents of which are hereby incorporated by reference.

BACKGROUND

Embodiments of the inventive concept relate to an electronic circuit, and more particularly, relate to an electronic circuit for adjusting a phase of a clock.

As information technology develops, technologies for communication between electronic devices are also developing. In particular, as wireless communication technologies evolve, electronic devices exchange signals through a variety of media. To transmit and/or receive signals through a variety of media, electronic devices include interface circuits to support various protocols.

As an interest in ubiquitous technology and biotechnology increases, human body communication technology for transmitting signals through a human body is attracting attention. The human body communication technology has been applied not only to mobile devices such as wearable devices, but also to various types of electronic devices designed for medical purposes.

A lot of noise may occur in the process of signal transmission through a human body. High-performance receivers are required to efficiently receive signals transmitted through the human body.

SUMMARY

Embodiments of the inventive concept provide an electronic circuit configured to invert a phase of the clock based on a difference between a phase of the input signal and a phase of the clock to align the clock with the input signal.

According to an example embodiment, an electronic circuit includes an oscillating circuit, a phase inverting circuit, and a phase detecting circuit. The oscillating circuit generates a first clock to be used to sample an input signal. The phase inverting circuit outputs a second clock based on the first clock. The phase detecting circuit generates a control signal having a first logic value when a phase difference between a phase of the input signal and a phase of the second clock is less than a reference value for a reference time or more. The phase detecting circuit generates the control signal having a second logic value when the phase difference is equal to or greater than the reference value or when the phase difference is less than the reference value for a time shorter than the reference time. The phase inverting circuit inverts the phase of the second clock when a logic value of the control signal changes from the first logic value to the second logic value or when a logic value of the control signal changes from the second logic value to the first logic value.

BRIEF DESCRIPTION OF THE FIGURES

The above and other objects and features of the inventive concept will become apparent by describing in detail example embodiments thereof with reference to the accompanying drawings.

DETAILED DESCRIPTION

Embodiments of the inventive concept will be described below in more detail with reference to the accompanying drawings. In the following descriptions, details such as detailed configurations and structures are provided merely to assist in an overall understanding of embodiments of the inventive concept. Modifications of the embodiments described herein can be made by those skilled in the art without departing from the spirit and scope of the inventive concept. Furthermore, descriptions of well-known functions and structures are omitted for clarity and brevity. The terms used in this specification are defined in consideration of the functions of the inventive concept and are not limited to specific functions. Definitions of terms may be determined based on the description in the detailed description.

In the following figures or the detailed description, circuits may be connected to others in addition to the components illustrated in drawing or described in the detailed description. The circuits or components may be directly or indirectly connected. The circuits or components may be communicatively connected or may be physically connected.

Unless defined otherwise, all terms including technical and scientific terms used herein have the same meaning as can be understood by one of ordinary skill in the art to which the inventive concept belongs. Generally, terms defined in the dictionary are interpreted to have equivalent meaning to the contextual meanings in the related art and are not to be construed as having ideal or overly formal meaning unless expressly defined in the text.

The terms "rising edge" and "falling edge" are used herein. The rising edge refers to a signal at a time point when a logic value transitions from logic value low to logic value high. The falling edge refers to a signal at a time point when a logic value transitions from logic value high to logic value low. As used herein, the term "edge" refers to a rising edge and a falling edge.

Figure 1:
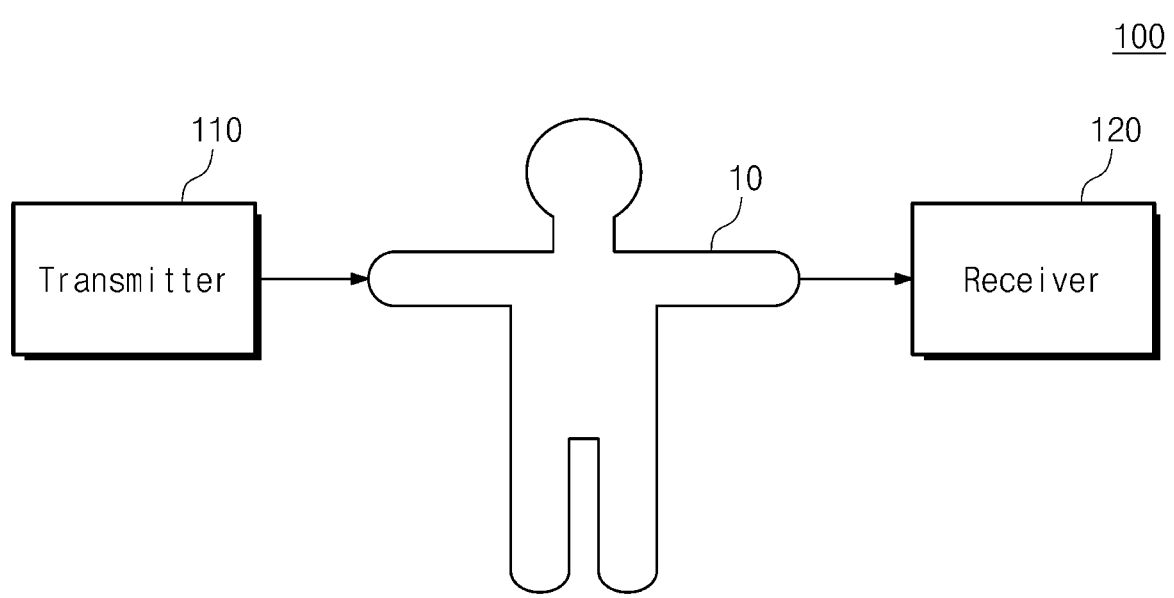
FIG. 1 is a block diagram illustrating a human body communication system according to an embodiment of the inventive concept.

FIG. 1 is a block diagram illustrating a human body communication system according to an embodiment of the inventive concept.

Referring to FIG. 1, a human body communication system 100 may include a transmitter 110 and a receiver 120 that communicate with each other through a human body 10. For example, the transmitter 110 and the receiver 120 may be included in an electronic device for implementing the human body communication system 100. For example, the electronic device may be one of a personal computer (PC), a workstation, a notebook computer, a mobile device, a wearable device, or the like. The electronic device may further include at least one component (e.g., a processor, a memory, or a storage device) that is not illustrated in FIG. 1. Alternatively, the electronic device may not include at least one of the components illustrated in FIG. 1.

The transmitter 110 may generate a clock to be used to transmit a data signal. The data signal may represent data processed or to be processed by various components included in the electronic device. For example, the electronic device may convert a data signal received from an outside of the human body communication system 100 and may transmit the converted data signal to the receiver 120 via the human body 10. The transmitter 110 may transmit the data signal to the receiver 120 through the human body 10, based on the clock.

The receiver 120 may receive the data signal from the transmitter 110 through the human body 10. The receiver 120 may generate a clock to be used to receive the data signal. For the purpose of operating in synchronization with the transmitter 110, the receiver 120 may be configured to generate a clock having a frequency substantially equal to a frequency of the clock generated by transmitter 110. For example, in the case where the frequency of the clock generated by the transmitter 110 is f0, the receiver 120 may be configured to generate a clock having a frequency f0.

However, actually, an error may occur between the frequency of a clock generated by the receiver 120 and the frequency of a clock generated by the transmitter 110. Accordingly, the receiver 120 may include a clock data recovery circuit (refer to FIG. 2) for compensating for the error.

Figure 2:
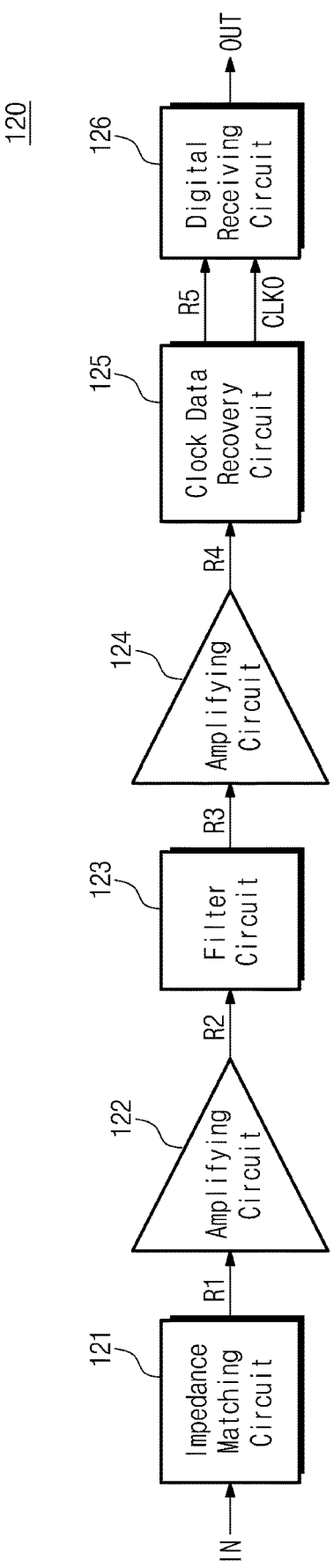
FIG. 2 is a block diagram illustrating an example configuration of a receiver of FIG. 1.

FIG. 2 is a block diagram illustrating an example configuration of the receiver of FIG. 1.

Referring to FIG. 2, the receiver 120 may include an impedance matching circuit 121, an amplifying circuit 122, a filter circuit 123, a comparing circuit 124, a clock data recovery circuit 125, and a digital receiving circuit 126.

The impedance matching circuit 121 may receive a signal IN from the transmitter 110 through the human body 10. As described with reference to FIG. 1, the signal IN may include a data signal. For example, the signal IN may represent digital data. The impedance matching circuit 121 may provide a signal R1 included in the signal IN to the amplifying circuit 122.

The impedance matching circuit 121 may be configured in such a manner that a front end impedance of the impedance matching circuit 121 and an impedance of the receiver 120 match each other. For example, the impedance matching circuit 121 may include at least one of resistors, inductive elements, and capacitive elements, which have various impedance values. As impedance matching is performed by the impedance matching circuit 121, a magnitude of a reflected wave generated when the receiver 120 receives the signal IN may decrease.

The amplifying circuit 122 may receive the signal R1 from the impedance matching circuit 121. The amplifying circuit 122 may amplify a level of the signal R1 to generate a signal R2. The amplifying circuit 122 may output the signal R2 to the filter circuit 123. For example, the amplifying circuit 122 may include at least one of a PA (Power Amplifier), an LPA (Linear Power Amplifier), an HPA (High Power Amplifier), an SSPA (Solid State Power Amplifier), a DRA (Drive Amplifier), a Low Noise Amplifier (LNA), a Buffer Amplifier, or the like.

The signal R2 may be filtered by the filter circuit 123. For example, the filter circuit 123 may be configured to reduce levels of frequency components having frequencies in a band except a passband, from among frequency components included in the signal R2. For example, the filter circuit 123 may include a bandpass filter. Accordingly, with respect to a frequency band except for the passband, a level of a signal R3 may be lower than a level of the signal R2.

For example, the transmitter 110 and the receiver 120 may communicate on the basis of a frequency band (hereinafter, referred to as a communication band) determined based on various communication protocols. Accordingly, frequencies of data signals that are output from the transmitter 110 may be included in the communication band. A designer of the receiver 120 may determine a passband of the filter circuit 123 in consideration of the communication band. For example, a designer may design the filter circuit 123 having a passband included in the communication band. As the signal R2 is filtered in a process of passing through the filter circuit 123, the signal R3 may be transmitted to the comparing circuit 124.

The comparing circuit 124 may receive the signal R3 from the filter circuit 123. The comparing circuit 124 may receive comparison voltages from a circuit such as a voltage generator (not illustrated) or the like. Since the signal IN represents digital data, the signal R3 that is generated based on the signal IN may also represent digital data. For example, the signal R3 having a level equal to or lower than a first level corresponds to logic value low, and the signal R3 having a level equal to or higher than a second level may correspond to logic value high of the signal IN. By way of example, the first level and the second level may be equal to each other, or the second level may be higher than the first level.

For example, the received comparison voltages may have a first level and a second level, respectively. The comparing circuit 124 may compare the comparison voltages with a level of the signal R3. The comparing circuit 124 may output a signal R4 having a logic value based on the comparison result. The comparing circuit 124 may output the signal R4 having logic value low in response to the level of the signal R3 lower than the first level, and may output the signal R4 having logic value high in response to the level of the signal R3 higher than the second level. Accordingly, the signal R4 may be a digital signal. The comparing circuit 124 may output the signal R4 to the clock data recovery circuit 125.

The clock data recovery circuit 125 may generate a clock CLK0 to be used when the digital receiving circuit 126 outputs a signal OUT from a signal R5. The clock data recovery circuit 125 may be configured to generate the clock CLK0 having a frequency substantially equal to a frequency of the clock generated by the transmitter 110. The clock data recovery circuit 125 may generate the signal R5 based on the generated clock CLK0 and the signal R4. Configurations and operations of the clock data recovery circuit 125 will be described in detail with reference to FIGS. 3 to 17.

The digital receiving circuit 126 may receive the signal R5 and the clock CLK0 from the clock data recovery circuit 125. The digital receiving circuit 126 may output the signal OUT by sampling the signal R5 based on the clock CLK0. Since the signal OUT is generated based on the signal IN, the signal OUT may represent data of the signal IN. The digital receiving circuit 126 may output the signal OUT to other components of the electronic device. For example, the digital receiving circuit 126 may output the signal OUT to a processor, a memory, a storage device, or the like.

Figure 3:
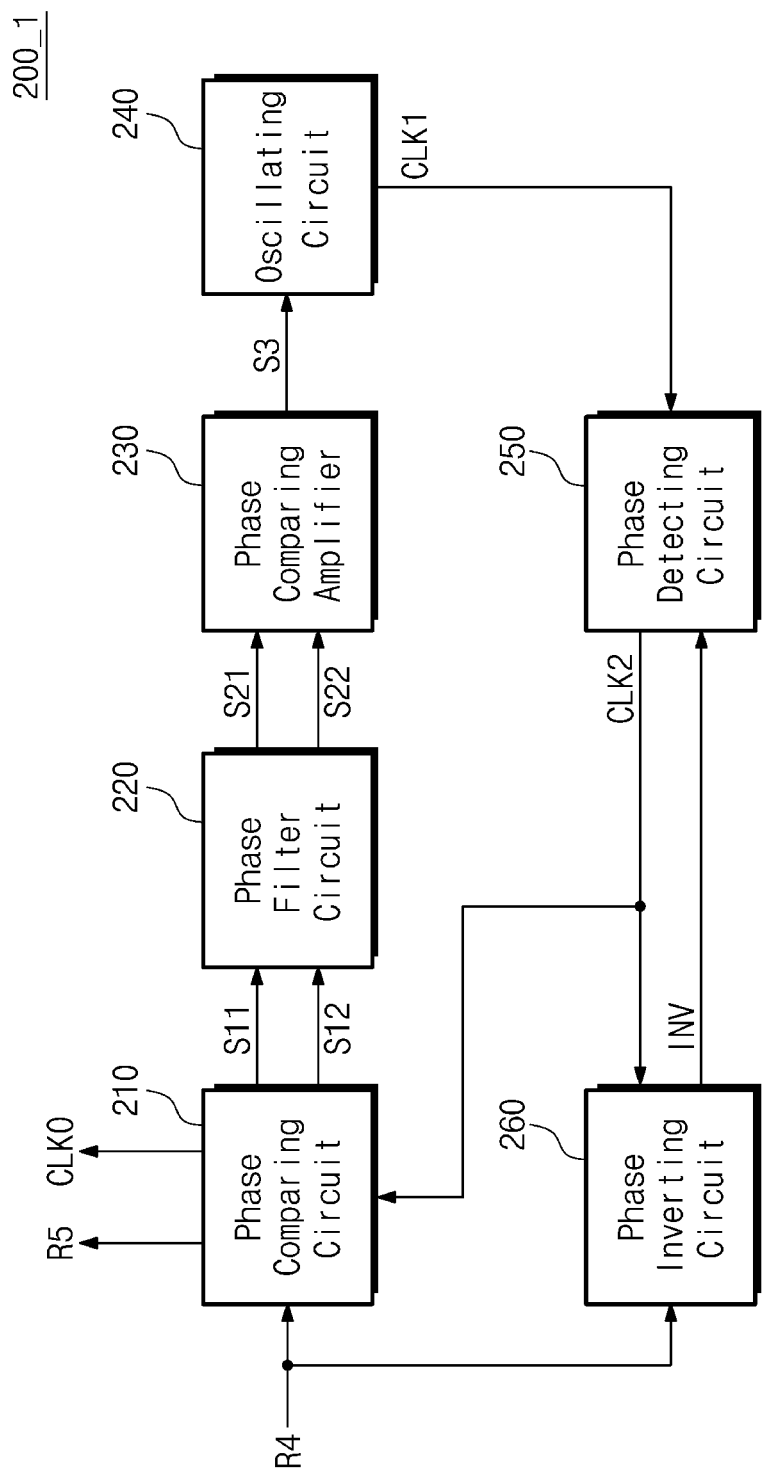
FIG. 3 is a block diagram illustrating an example configuration of a clock data recovery circuit of FIG. 2.

FIG. 3 is a block diagram illustrating an example configuration of the clock data recovery circuit of FIG. 2. The clock data recovery circuit 125 of FIG. 2 may include a clock data recovery circuit 200_1 of FIG. 3.

Referring to FIG. 3, the clock data recovery circuit 200_1 may include a phase comparing circuit 210, a phase filter circuit 220, a phase comparing amplifier 230, an oscillating circuit 240, a phase inverting circuit 250, and a phase detecting circuit 260.

The phase comparing circuit 210 may receive the signal R4 from the comparing circuit 124 and receive a clock CLK2 from the phase inverting circuit 250. The phase comparing circuit 210 may output the signal R5 based on the signal R4 and the clock CLK2. The phase comparing circuit 210 may pass the clock CLK2 to output the clock CLK0. The clock CLK0 may be substantially the same as the clock CLK2. The phase comparing circuit 210 may generate a signal S11 and a signal S12 based on the signal R4 and the clock CLK2.

For example, the phase comparing circuit 210 may output the signal S11 that is associated with a difference between a phase of the signal R4 and a phase of the clock CLK2. The phase comparing circuit 210 may generate the signal S12 having a level that is uniformly maintained based on the signal R4 and the clock CLK2. Example configurations and operations of the phase comparing circuit 210 will be described in more detail with reference to FIG. 4.

As the signals S11 and S12 pass through the phase filter circuit 220, the signals S11 and S12 may be filtered. The phase filter circuit 220 may provide signals S21 and S22, obtained by filtering the signals S11 and S12, to the phase comparing amplifier 230. For example, the phase filter circuit 220 may attenuate frequency components, which are equal to or higher than a cut-off frequency, from among frequency components included in the signals S11 and S12, and may output the signals S21 and S22. For example, the phase filter circuit 220 may include a low-pass filter. The signals S11, S12, S21, and S22 will be described in more detail with reference to FIGS. 6 and 7.

The phase comparing amplifier 230 may receive the signals S21 and S22 from the phase filter circuit 220. The phase comparing amplifier 230 may generate a signal S3 based on a difference between levels of the signals S21 and S22. For example, a level of the signal S3 may correspond to a value obtained by subtracting a level of the signal S22 from a level of the signal S21.

For example, the phase comparing amplifier 230 may include a differential amplifier configured to receive the signal S21 through a non-inverting terminal and to receive the signal S22 through an inverting terminal. In addition, the phase comparing amplifier 230 may further include a non-inverting amplifier configured to amplify an output of the differential amplifier.

According to the operations described above, the level of the signal S3 may vary depending on a difference between a phase of the signal R4 and a phase of the clock CLK2. For example, as the difference between the phase of the signal R4 and the phase of the clock CLK2 increases, an average level of the signal S11 may increase. As the average level of the signal S11 increases, the level of the signal S21 may increase. The higher the level of the signal S21 is, the higher the level of the signal S3 may be. Accordingly, the greater the difference between the phase of the signal R4 and the phase of the clock CLK2 is, the higher the level of the signal S3 may be.

The oscillating circuit 240 may receive the signal S3 from the phase comparing amplifier 230. The oscillating circuit 240 may generate a clock CLK1 having an adjusted phase based on the level of the signal S3. For example, the oscillating circuit 240 may generate the clock CLK1 having a lag phase based on the signal S3 of a high level and may generate the clock CLK1 having an lead phase based on the signal S3 of a low level.

Since the level of the signal S3 is associated with the difference between the phase of the signal R4 and the phase of the clock CLK2, the phase of the clock CLK1 may be adjusted depending on the difference between the phase of the signal R4 and the phase of the clock CLK2. Therefore, the phase of the clock CLK2 that is fed back to the phase comparing circuit 210 may also be adjusted based on the clock CLK1. As the phase of the clock CLK2 is adjusted, the difference between the phase of the clock CLK2 and the phase of the signal R4 may be adjusted.

As the difference, between the phase of the clock CLK2 and the phase of the signal R4, is adjusted, the level of the signal S3 may be changed again. As the changed level of the signal S3 is applied in the clock CLK2, the difference between the phase of the signal R4 and the phase of the clock CLK2 may be adjusted again. With the above-described operations, the difference between the phase of the signal R4 and the phase of the clock CLK2 may be repeatedly adjusted by the clock data recovery circuit 200_1.

The oscillating circuit 240 may adjust the phase of the clock CLK1 to align the clock CLK2 with the signal R4. For example, as the oscillating circuit 240 may align the rising edge of the clock CLK2 with the signal R4, a rising edge of the clock CLK0 may be aligned with the signal R5. Accordingly, since the oscillating circuit 240 may adjust the phase of the clock CLK1, the digital receiving circuit 126 may sample the signal R5 based on the clock CLK0 with sufficient margin. Example configurations and operations of oscillating circuit 240 will be described in more detail with reference to FIG. 5.

The phase inverting circuit 250 may receive the clock CLK1 from the oscillating circuit 240 and receive a signal INV from the phase detecting circuit 260. The phase inverting circuit 250 may output the clock CLK2 based on the signal INV and the clock CLK1. The phase of the clock CLK2 may be substantially equal to the phase of the clock CLK1 or may be opposite to the phase of the clock CLK1.

For example, although the phase of the clock CLK1 was primarily adjusted by the operation of the oscillating circuit 240, the phase of the clock CLK2 generated from the clock CLK1 may not be aligned with the signal R4. The phase inverting circuit 250 may invert the phase of the clock CLK2 to align the rising edges of the clock CLK2 with the signal R4.

For example, the phase inverting circuit 250, which has inverted the phase of the clock CLK1 and has output the clock CLK2, may stop an operation for inverting the clock CLK1, and then may pass the clock CLK1 to output the clock CLK2 substantially the same as the clock CLK1.

Alternatively, the phase inverting circuit 250, which has output the clock CLK2 substantially the same as the clock CLK1, may invert the phase of the clock CLK1 to output the clock CLK2.

For example, the phase inverting circuit 250 may invert the phase of the clock CLK2 when a logic value of the signal INV transitions, for example, in response to a rising edge or a falling edge of the signal INV.

The phase detecting circuit 260 may receive the clock CLK2 from the phase inverting circuit 250 and may receive the signal R4 from the comparing circuit 124. The phase detecting circuit 260 may generate the signal INV for controlling the phase inverting circuit 250 based on the difference between the phase of the signal R4 and the phase of the clock CLK2. For example, when an time interval between an edge of the signal R4 and the rising edge of the clock CLK2 is maintained at a reference value or less for a reference time or more, the phase detecting circuit 260 may allow a logic value of the signal INV to transition.

For example, in a case where the time interval between the edge of the signal R4 and the rising edge of the clock CLK2 is maintained at the reference value or less for the reference time or more, a designer of the receiver 120 may determine that the clock CLK2 is not aligned with the signal R4 (i.e., the rising edge of the clock CLK2 is not centered with respect to the signal R4). The reference time and the reference value may be set based on the designer's experience and the like.

Since the phase of the clock CLK1 is primarily adjusted by the oscillating circuit 240 and the clock CLK2 is output based on the clock CLK1 under control of the phase detecting circuit 260 and the phase inverting circuit 250, the difference between the phase of the clock CLK2 and the phase of the signal R4 may be adjusted efficiently and quickly. In detail, the clock data recovery circuit 200_1 may quickly align the rising edge of the clock CLK2 with the signal R4 such that the digital receiving circuit 126 can sample the signal R5 based on the clock CLK0 with sufficient margin.

Example configurations and operations of the phase detecting circuit 260 will be described in more detail with reference to FIGS. 8 and 9. Also, example configurations and operations of the phase detecting circuit 260 will be described in more detail with reference to FIG. 10 to FIG. 12.

Figure 4:
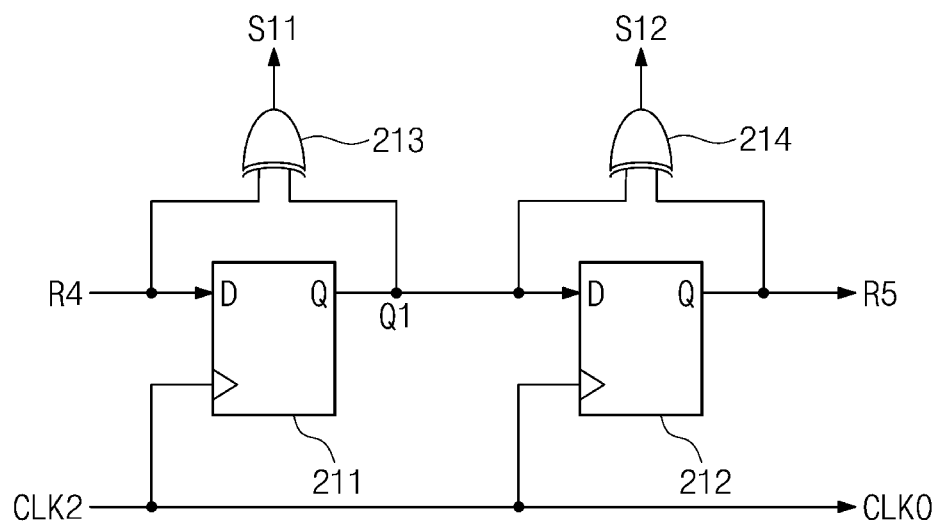
FIG. 4 is a circuit diagram illustrating an example configuration of a phase comparing circuit of FIG. 3.

FIG. 4 is a circuit diagram illustrating an example configuration of a phase comparing circuit of FIG. 3.

Referring to FIG. 4, the phase comparing circuit 210 may include flip-flops 211 and 212 and XOR operators 213 and 214.

The flip-flop 211 may receive the signal R4 from the comparing circuit 124. The flip-flop 211 may continuously output a logic value of the signal R4 sampled in response to the rising edge of the clock CLK2. In further detail, the flip-flop 211 may output a signal Q1 having the same logic value as the logic value of the signal R4 in response to the rising edge of the clock CLK2. The flip-flop 211 may maintain the logic value of the signal Q1 until a subsequent rising edge of the clock CLK2 is received.

The XOR operator 213 may receive the signal R4 and the signal Q1. When the logic value of the signal R4 is equal to the logic value of the signal Q1, the XOR operator 213 may output the signal S11 having logic value low. When the logic value of the signal R4 is different from the logic value of the signal Q1, the XOR operator 213 may output the signal S11 having logic value high. The operations of the flip-flop 212 are similar to the operations of the flip-flop 211 and the operations of the XOR operator 214 are similar to the operations of the XOR operator 213, and thus, additional descriptions will be omitted to avoid redundancy.

For example, the flip-flop 211 may output the signal Q1 having a logic value of the signal R4 in response to the rising edge of the clock CLK2, the flip-flop 212 may output the signal R5 having a logic value of the signal Q1. As the logic value of the signal R4 is equal to the logic value of the signal Q1, the XOR operator 213 may output the signal S11 having logic value low. As the logic value of the signal Q1 is equal to the logic value of the signal R5, the XOR operator 214 may output the signal S12 having logic value low.

The logic values of the signals Q1 and R5 may be maintained until the subsequent rising edge of the clock CLK2 is input to the flip-flops 211 and 212. Accordingly, the logic value of the signal S12 may be maintained at logic value low. Even before the subsequent rising edge of clock CLK2 is received by the flip-flops 211 and 212, the XOR operator 213 may output the signal S11 of logic value high in a case where the logic value of the signal R4 changes (i.e., in response to the rising edge and the falling edge of the signal R4).

As described above with reference to FIG. 4, the logic value of the signal S11 may change in response to the rising edge of the clock CLK2 and the edge, for example, the rising edge and the falling edge of the signal R4, the logic value of the signal S12 may be uniformly maintained regardless of the signal R4 and the clock CLK2. The examples of the signals S11 and S12 which change in response to the signal R4 and the clock CLK2 will be described with reference to FIGS. 6 and 7.

Figure 5:
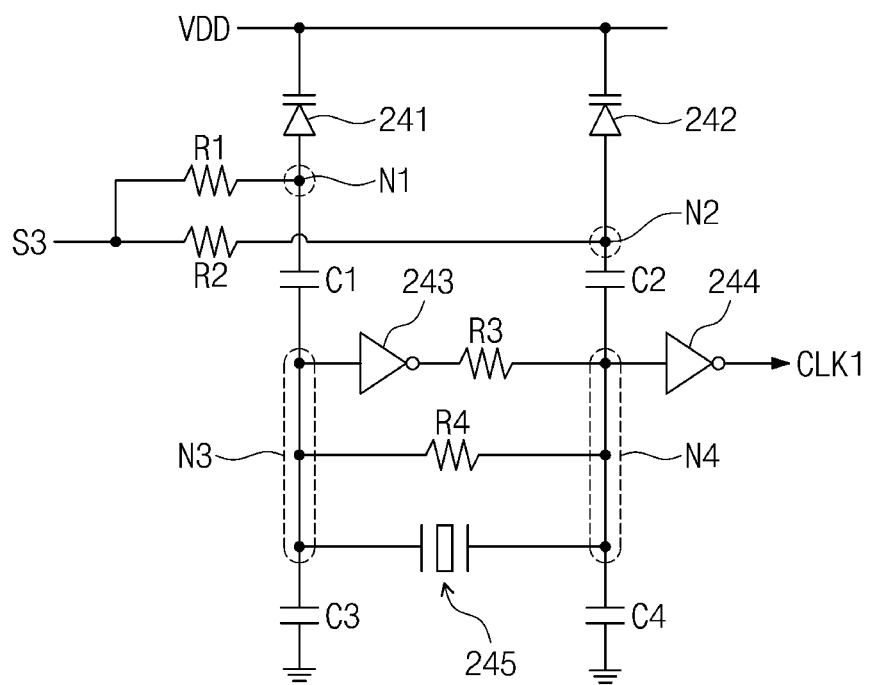
FIG. 5 is a circuit diagram illustrating an example configuration of an oscillating circuit of FIG. 3.

FIG. 5 is a circuit diagram illustrating an example configuration of an oscillating circuit in FIG. 3.

Referring to FIG. 5, the oscillating circuit 240 may include resistors R1 to R4, capacitive elements C1 to C4, inverters 243 and 244, diodes 241 and 242, and an oscillation element 245.

The oscillating circuit 240 may receive the signal S3 from the phase comparing amplifier 230. The signal S3 may be provided to a node N1 through the resistor R1 and may be provided to a node N2 through the resistor R2. The diode 241 may be connected between the node N1 and a supply terminal of a voltage VDD. The diode 242 may be connected between the node N2 and the supply terminal of the voltage VDD.

The capacitive element C1 may be connected between the node N1 and a node N3. The capacitive element C2 may be connected between the node N2 and a node N4. The inverter 243 may invert a phase of the voltage formed at the node N3 and may provide the phase-inverted voltage to the resistor R3. The resistor R3 may be connected between the inverter 243 and the node N4. The resistor R4 may be connected between the node N3 and the node N4. The oscillation element 245 may be connected between the node N3 and the node N4. The capacitive element C3 may be connected between the node N3 and a ground terminal. The capacitive element C4 may be connected between the node N4 and the ground terminal.

The diode 241 may have a capacitance that varies depending on a level of a voltage formed between opposite terminals of the diode 241. In the example of FIG. 5, the diode 241 may have a capacitance corresponding to the difference between the level of the voltage formed at the node N1 and the level of the voltage VDD. For example, in a case in which the level of the voltage VDD is uniform and the level of the voltage at the node N1 increases, the capacitance of the diode 241 may increase. Since the change in the capacitance of the diode 242 is similar to the change in the capacitance of the diode 241, additional descriptions will be omitted to avoid redundancy. For example, each of the diodes 241 and 242 may be implemented as a varactor diode.

The oscillation element 245 may oscillate a voltage formed between both terminals of the oscillation element 245. In the example of FIG. 5, the voltage of the node N3 and the voltage of the node N4 may be oscillated by the oscillation element 245. A frequency (hereinafter referred to as an "oscillation frequency") of the voltage oscillating on the node N3 and an oscillation frequency of the node N4 may depend on a physical characteristic of the oscillation element 245.

For example, a signal that is input to the receiver 120 through the human body 10 in the human communication system 100 may include a lot of noise. Accordingly, a designer of the human body communication system 100 may use the oscillation element 245 that generates a voltage having a relatively high Q-factor for the purpose of processing the signal including a large amount of noise. For example, the oscillation element 245 may be implemented as a crystal oscillation element. The oscillation frequency of the crystal oscillation element may be determined based on the crystralline size (for example, a thickness) of a crystal included in the crystal oscillation element.

The resistors R3 and R4 and the inverter 243 may provide a path for oscillation between the node N3 and the node N4. The inverter 244 may invert a phase of a voltage of the node N4 and may output a voltage having the inverted phase as the clock CLK1. A phase of the clock CLK1 may depend on the frequency of the voltage oscillating at the node N4, for example, an oscillation frequency.

As a composite capacitance of the capacitive element C1 and the diode 241 and a composite capacitance of the capacitive element C2 and the diode 242 (or varactor diode) increase, an energy stored in the capacitive element C1 and the diode 241 and an energy stored in capacitive element C2 and the diode 242 (or varactor diode) may increase. Accordingly, the oscillation frequency of the voltage that oscillates at the node N3 may vary depending on the capacitance of the diode 241, and the oscillation frequency of the voltage that oscillates at the node N4 may vary depending on the capacitance of the diode 242.

Since the capacitances of the diodes 241 and 242 vary depending on voltages formed at the nodes N1 and N2, respectively, the oscillation frequency of a voltage formed at the node N4 may vary based on the signal S3. For example, as the level of the signal S3 becomes higher, the capacitances of the diodes 241 and 242 may become greater. Accordingly, the oscillation frequency of each of the voltage of the node N3 and the voltage of the node N4 may be lowered. Therefore, the phase of the clock CLK1 output through the inverter 243 may be delayed. As in the above description, as the level of the signal S3 becomes lower, the phase of the clock CLK1 may be more advanced.

As described above, the oscillating circuit 240 may output the clock CLK1 having a phase that is adjusted depending on the level of the signal S3.

Figure 6:
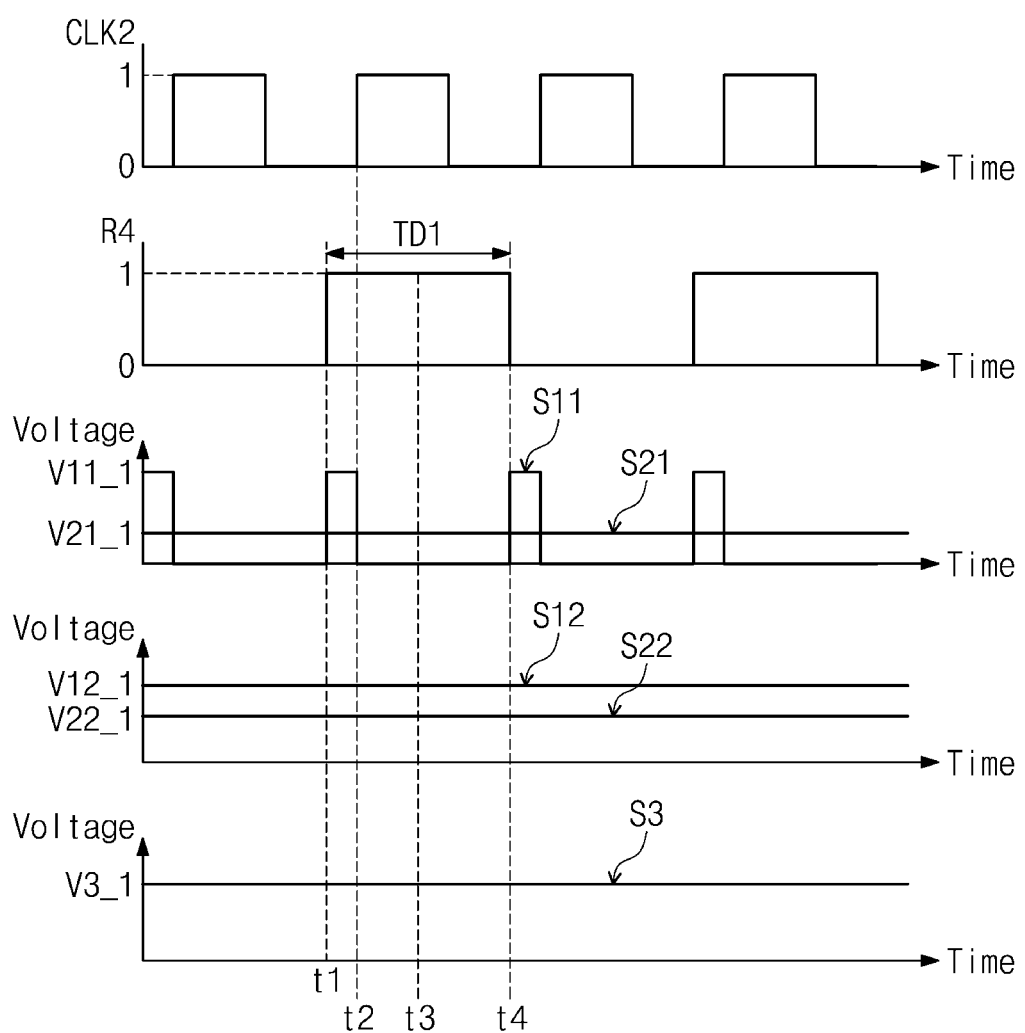
FIG. 6 is a graph for describing operations of a clock data recovery circuit of FIG. 3.

FIG. 6 is a diagram for illustrating graphs for describing example operations of a clock data recovery circuit of FIG. 3. In graphs of FIG. 6, X-axes represent a time, and Y-axes represent the logic values of the signal R4 and the clock CLK2, and the levels of the signals S11, S12, S21, S22, and S3. With regard to the signal S11, a level V11_1 may correspond to logic value high. With regard to the signal S12, a level V12_1 may correspond to logic value low.

Referring to FIG. 6, the signal R4 may have logic value high in a time interval TD1 from a time point t1 to a time point t4. A middle time point of the time interval TD1, for example, a middle time point between a point in time t1 and a point in time t4, may be a time point t3. Hereinafter, example operations of the clock data recovery circuit 200_1, when the rising edge of the clock CLK2 is received by the phase comparing circuit 210 at a time point t2 earlier than the time point t3, will be described with reference to FIG. 6.

As described above with reference to FIG. 4, at the time point t2, in response to the rising edge of the clock CLK2, the logic value of the signal S11 may change from logic value high to logic value low. The logic value of the signal S11 may be maintained from the time point t2 to the time point t4. At the time point t4 in response to the falling edge of the signal R4, the logic value of the signal S11 may change from logic value low to logic value high.

Therefore, a width of a pulse included in the signal S11 may correspond to a difference between the phase of the signal R4 and the phase of the clock CLK2 (an time interval between the rising edge of the signal R4 at the time point t1 and the rising edge of the clock CLK2 at the time point t2). For example, as the difference between the phase of the signal R4 and the phase of the clock CLK2 becomes smaller, the width of the pulse included in the signal S11 may become smaller. As described above with reference to FIG. 4, the logic value of the signal S12 may be uniformly maintained regardless of the signal R4 and the clock CLK2.

As described above with reference to FIG. 3, as the signal S11 is filtered by phase filter circuit 220, the signal S21 having a level V21_1 (i.e., having a low frequency) that is uniformly maintained may be output from phase filter circuit 220. Since the signal S11 is associated with the difference between the phase of the clock CLK2 and the phase of the signal R4, the level of the signal S21 may also be associated with the difference between the phase of the clock CLK2 and the phase of the signal R4. As the signal S12 is filtered by the phase filter circuit 220, the signal S22 having a level V22_1 (i.e., having a low frequency) that is uniformly maintained may be output from the phase filter circuit 220.

For better understanding, although the signals S21 and S22 respectively having the levels V21_1 and V22_1 that are uniformly maintained, are described above with reference to FIG. 6, the levels of the signals S21 and S22 may vary slightly over time.

The phase comparing amplifier 230 may output the signal S3 having a level V3_1 that is associated with a value obtained by subtracting the level V22_1 of the signal S22 from the level V21_1 of the signal S21.

Figure 7:
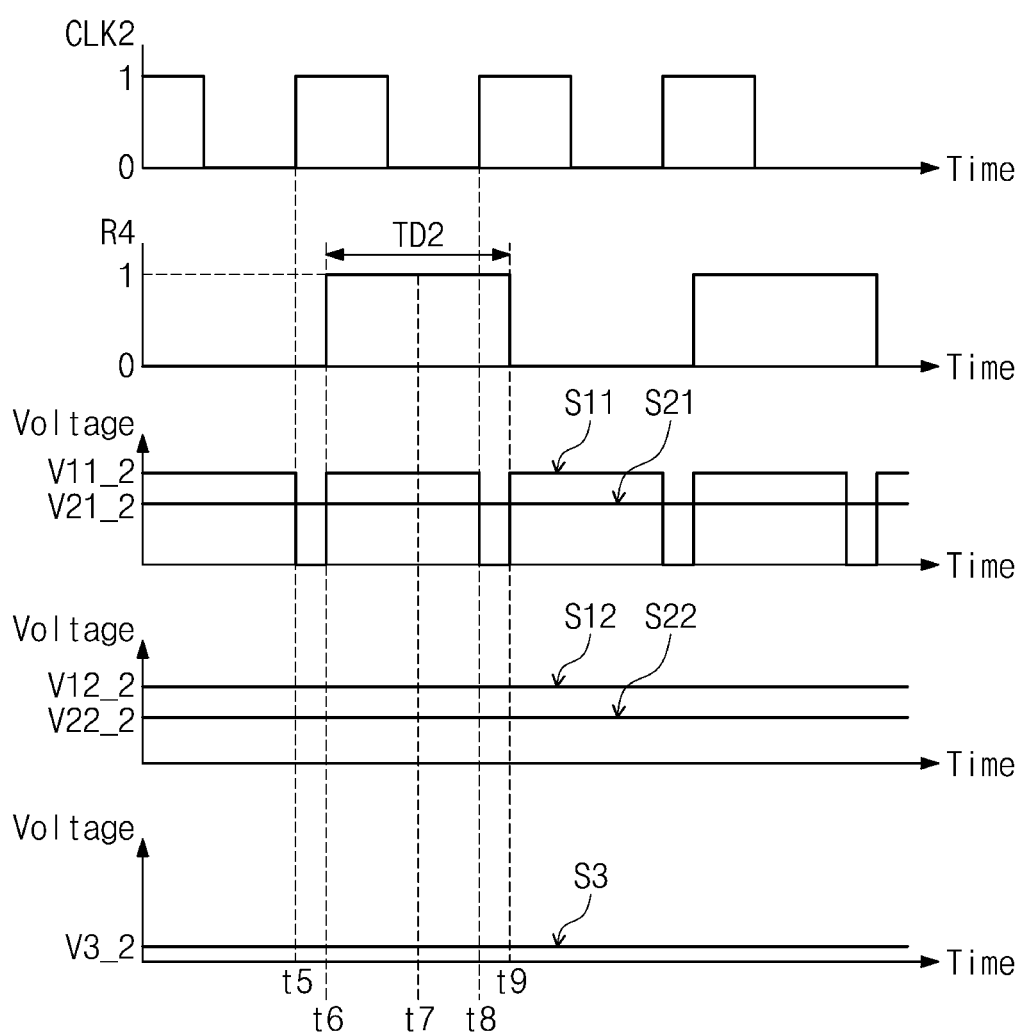
FIG. 7 is a graph for describing operations of a clock data recovery circuit of FIG. 3.

FIG. 7 is a diagram for illustrating graphs for describing example operations of a clock data recovery circuit of FIG. 3. In graphs of FIG. 7, X-axes represent a time, and Y-axes represent logic values of the signal R4 and the clock CLK2, and magnitudes of the signals S11, S12, S21, S22, and S3. With regard to the signal S11, level V11_2 may correspond to logic value high. With regard to the signal S12, level V12_2 may correspond to logic value low.

Referring to FIG. 7, the signal R4 may have logic value high in a time interval TD2 from a time point t6 to a time point t9. A middle time point of the time interval TD2, for example, a middle time point between the time point t6 and the time point t9, may be a time point t7. Hereinafter, example operations of the clock data recovery circuit 200_1 when the rising edge of the clock CLK2 is input to the phase comparing circuit 210 at a time point t8 later than the time point t7 will be described with reference to FIG. 7.

As described above with reference to FIG. 4, at a time point t5, in response to the rising edge of the clock CLK2, a logic value of the signal S11 may change from logic value high to logic value low. The logic value of the signal S11 may be maintained from the time point t5 to the time point t6. At the time point t6, in response to the rising edge of the signal R4, the logic value of the signal S11 may change from logic value low to logic value high.

As in the above description, at the time point t8, a logic value of the signal S11 may change from logic value high to logic value low, and at the time point t9, the logic value of the signal S11 may change from logic value low to logic value high. The logic value of the signal S12 may be maintained regardless of the logic values of the signal R4 and the clock CLK2.

As described above with reference to FIG. 3, as the signal Si 1 is filtered by the phase filter circuit 220, the signal S21 having a level V21_2 (i.e., having a low frequency) that is uniformly maintained may be output from the phase filter circuit 220. As the signal S12 is filtered by the phase filter circuit 220, the signal S22 having a level V22_2 (i.e., having a low frequency) that is uniformly maintained may be output from the phase filter circuit 220.

The phase comparing amplifier 230 may output the signal S3 having a level V3_2 which is associated with a value obtained by subtracting the level V22_2 of the signal S22 from the level V21_2 of the signal S21.

With regard to the signal S3, since the average level of the signal S11 in FIG. 6 is lower than the average level of the signal S11 in FIG. 7, the level V3_2 in FIG. 7 may be lower than the level V3_1 in FIG. 6. As described with reference to FIG. 5, in response to the signal S3 having the relatively high level V3_1, the oscillating circuit 240 may output the clock CLK1 having a phase which relatively lagged. Accordingly, a time interval between the rising edge of the clock CLK2 and the middle time point of the time interval TD1 may be decreased (i.e., the rising edge of the clock CLK2 may be centered with respect to the signal R4). As in the above description, in response to the signal S3 having the relatively lower level V3_2, the rising edge of the clock CLK2 may be aligned with the signal R4.

Figure 8:
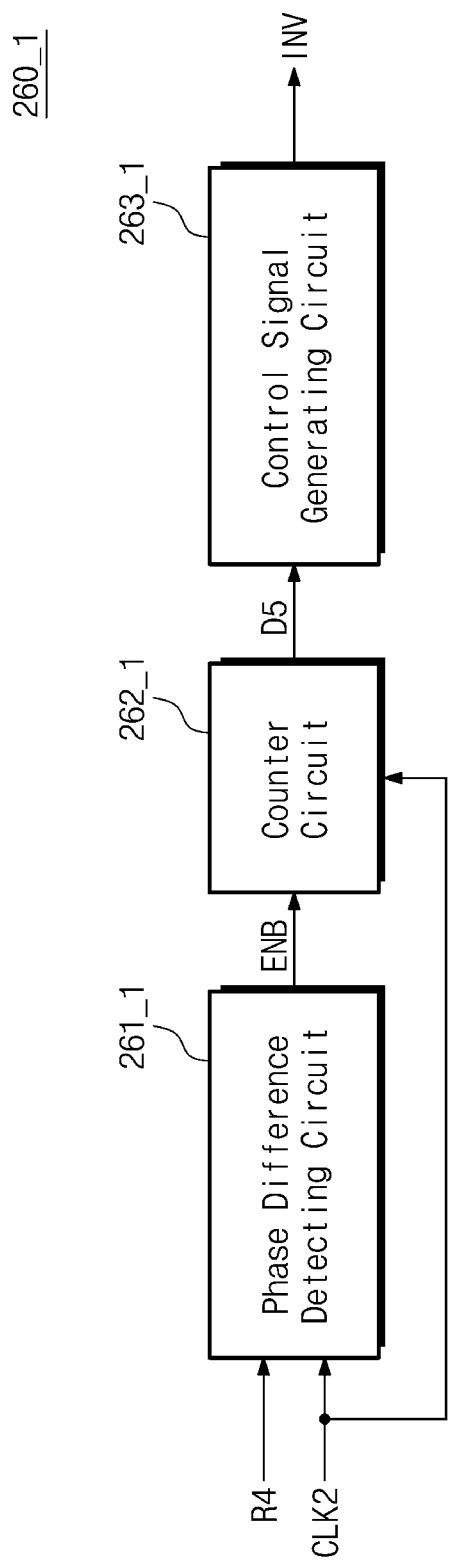
FIG. 8 is a block diagram illustrating an example configuration of a phase detecting circuit of FIG. 3.

FIG. 8 is a block diagram illustrating an example configuration of a phase detecting circuit of FIG. 3.

The phase detecting circuit 260 in FIG. 3 may include the phase detecting circuit 260_1 in FIG. 8. Referring to FIG. 8, the phase detecting circuit 260_1 may include a phase difference detecting circuit 261_1, a counter circuit 262_1, and a control signal generating circuit 263_1.

The phase difference detecting circuit 261_1 may receive the signal R4 from the comparing circuit 124 in FIG. 2 and may receive the clock CLK2 from the phase inverting circuit 250. The phase difference detecting circuit 261_1 may output a signal ENB for controlling the counter circuit 262_1, based on a difference between the phase of the signal R4 and the phase of the clock CLK2.

For example, when a time interval between the edge of the signal R4 and the rising edge of the clock CLK2 is equal to or less than the reference value, the phase difference detecting circuit 261_1 may output the signal ENB having logic value low. When the time interval between the edge of the signal R4 and the rising edge of the clock signal CLK2 is greater than the reference value, the phase difference detecting circuit 261_1 may output the signal ENB having logic value high.

The counter circuit 262_1 may receive the signal ENB from the phase difference detecting circuit 261_1. For example, the counter circuit 262_1 may count pulses included in the clock CLK2 in response to the signal ENB of logic value low. When the number of counted pulses exceeds the number of pulses (hereinafter referred to as a "reference count") corresponding to the reference time, the counter circuit 262_1 may output a signal D5 having logic value low. The counter circuit 262_1 may output the signal D5 having logic value high in response to the signal ENB of logic value high.

The control signal generating circuit 263_1 may receive the signal D5 from the counter circuit 262_1. The control signal generating circuit 263_1 may output a signal INV for controlling the phase inverting circuit 250 based on the signal D5. For example, the control signal generating circuit 263_1 may allow a logic value of the signal INV to transition based on the signal D5 having logic value low. When the logic value of the signal D5 is logic value high, the control signal generating circuit 263_1 may maintain the logic value of the signal INV.

Figure 9:
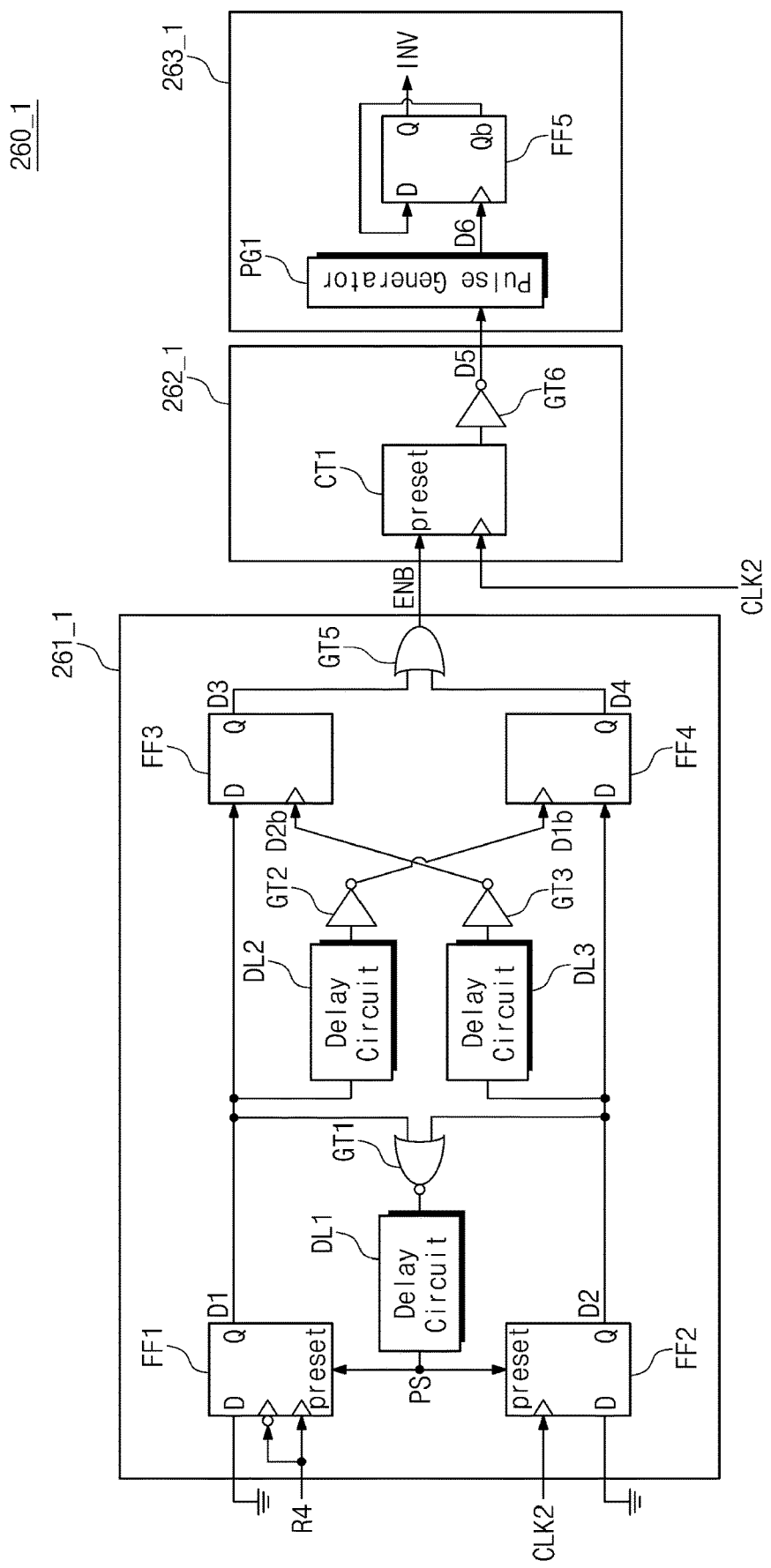
FIG. 9 is a circuit diagram illustrating an example configuration of a phase detecting circuit of FIG. 8.

FIG. 9 is a circuit diagram illustrating an example configuration of a phase detecting circuit of FIG. 8.

Referring to FIG. 9, the phase difference detecting circuit 261_1 may include delay circuits DL1 to DL3, flip-flops FF1 to FF4, a NOR operator GT1, and inverters GT2 and GT3. The counter circuit 262_1 may include a counter 264 and an inverter GT6. The control signal generating circuit 263_1 may include a pulse generator PG1 and a flip-flop FF5.

The flip-flop FF1 may sample a ground voltage in response to a rising edge and a falling edge of the signal R4. The flip-flop FF1 may output a signal D1 having logic value low (i.e., the logic value corresponding to the ground voltage) through the sampling. The flip-flop FF1 may output the signal D1 having logic value high in response to a signal PS having logic value high (preset operation).

The flip-flop FF2 may sample the ground voltage in response to the rising edge of the clock CLK2. The flip-flop FF2 may output a signal D2 having logic value low (i.e., a logic value corresponding to the ground voltage) through the sampling. The flip-flop FF2 may output the signal D2 having logic value high in response to the signal PS having logic value high (preset operation).

When both a logic value of the signal D1 and a logic value of the signal D2 are logic value low, the NOR operator GT1 may output a signal having logic value high to the delay circuit DL1. When at least one of the logic value of the signal D1 and the logic value of the signal D2 is logic value high, the NOR operator GT1 may output a signal having logic value low to the delay circuit DL1. The delay circuit DL1 may delay the signal output from the NOR operator GT1 and may provide the delayed signal as the signal PS to the flip-flops FF1 and FF2.

The signal D1 may be delayed by the delay circuit DL2, the delayed signal output from the delay circuit DL2 may be inverted by the inverter GT2, and the inverted signal output from the inverter GT2 may be provided to the flip-flop FF4 as a signal D1b. The signal D2 may be delayed by the delay circuit DL3, the delayed signal output from the delay circuit DL3 may be inverted by the inverter GT3, and the inverted signal output from the inverter GT3 may be provided to the flip-flop FF3 as a signal D2b.

The flip-flop FF3 may sample the signal D1 in response to the rising edge of the signal D2b. The flip-flop FF3 may output the signal D3 having the logic value of the sampled signal D1 to the OR operator GT5. The flip-flop FF4 may sample the signal D2 in response to the rising edge of the signal D1b. The flip-flop FF4 may output the signal D4 having the logic value of the sampled signal D2 to the OR operator GT5.

When both the logic value of the signal D3 and the logic value of the signal D4 are logic value low, the OR operator GT5 may output the signal ENB having logic value low. When at least one of the logic value of the signal D3 and the logic value of the signal D4 is logic value high, the OR operator GT5 may output the signal ENB having logic value high.

The counter CT1 may count the number of pulses included in the clock CLK2 in response to the signal ENB of logic value low. When the counted number of pulses is equal to or greater than the reference count, the counter 264 may output a signal having logic value high to the inverter GT6. The inverter GT6 may invert the signal output from the counter 236 to output the signal D5 to the pulse generator PG1.

The pulse generator PG1 may receive the signal D5 from the inverter GT6. The pulse generator PG1 may generate a pulse having logic value low in response to a falling edge of the signal D5. The pulse generator PG1 may output the signal D6 including the pulse to the flip-flop FF5.

The flip-flop FF5 may allow the logic value of the signal INV to transition in response to a rising edge of the signal D6. For example, when the logic value of the signal INV is logic value low before the rising edge of the signal D6 is input to the flip-flop FF5, the flip-flop FF5 may output the signal INV having logic value high in response to the rising edge of the signal D6. When the logic value of the signal INV is logic value high before the rising edge of the signal D6 is input to the flip-flop FF5, the flip-flop FF5 may output the signal INV having logic value low in response to the rising edge of the signal D6.

Figure 10:
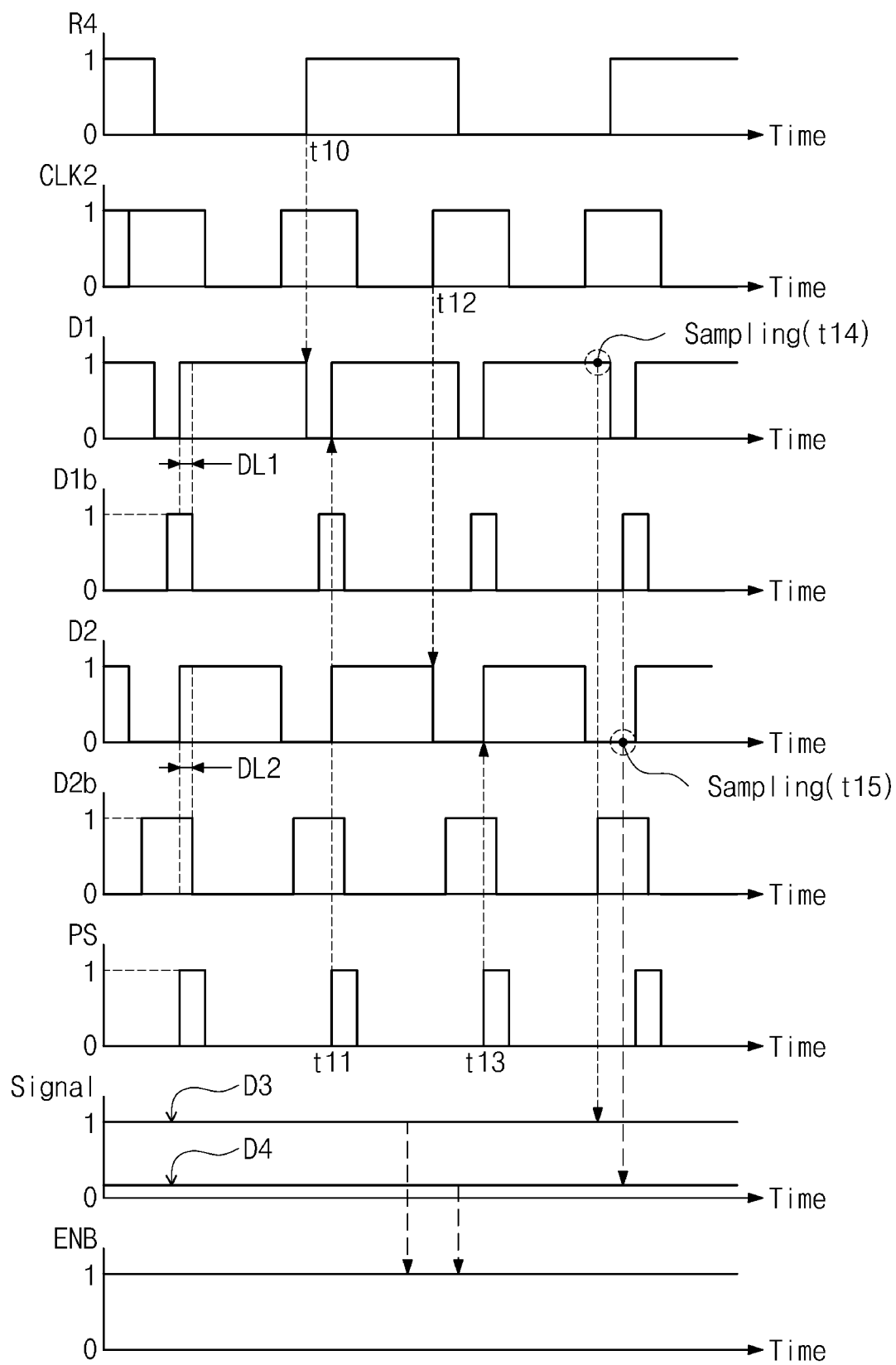
FIG. 10 is a graph for describing example operations of a phase detecting circuit of FIG. 9.

FIG. 10 is a diagram illustrating graphs for describing example operations of a phase detecting circuit of FIG. 9. X-axes represent a time, and Y-axes represent logic values of signals R4, D1 to D4, D1b, D2b, PS, and ENB and the clock CLK2. A logic value of "1" represents logic value high, and a logic value of "0" represents logic value low.

With regard to the case where a time interval between the edge of the signal R4 and the rising edge of the clock CLK2 (for example, the rising edge and the falling edge) is longer than the reference value, example operations of the phase detecting circuit 260_1 will be described with reference to FIG. 9 and FIG. 10.

According to the operation of the flip-flop FF1, the signal D1 may sequentially and repeatedly have logic value low of the ground voltage sampled by the rising edge of the signal R4 and logic value high preset by the rising edge of the signal PS.

For example, at a time point t10, the flip-flop FF1 may sample the logic value low of the ground voltage in response to the rising edge of the signal R4. Through a sampling operation performed at the time point t10, the signal D1 may have logic value low in a time interval from the time point t10 to the time point t11. At the time point t11, the flip-flop FF1 may preset the logic value of the signal D1 in response to the rising edge of the signal PS. By the preset at the time point t11, the signal D1 may have logic value high after the time point t11.

According to the operation of the flip-flop FF2, the signal D2 may sequentially and repeatedly have logic value low of the ground voltage sampled by the rising edge of the clock CLK2 and logic value high preset by the rising edge of the signal PS.

For example, at a time point t12, the flip-flop FF2 may sample the logic value low of the ground voltage in response to the rising edge of the signal R4. By the sampling at the time point t12, the signal D2 may have logic value low in a time interval from the time point t12 to a time point t13. At the time point t13, the flip-flop FF2 may preset the logic value of the signal D2 in response to the rising edge of the signal PS. The preset operation performed at the time point t13 may allow the signal D2 to have logic value high after the time point t13.

The signal D1 may be delayed by the delay circuit DL2. For example, the signal D1 may be delayed by a time interval DL1. The signal D1 delayed by the delay circuit DL2 may be inverted by the inverter GT2 to output a signal D1b. The signal D2 may be delayed by the delay circuit DL3. For example, the signal D2 may be delayed by a time interval DL2. The signal D2 delayed by the delay circuit DL3 may be inverted by the inverter GT3 to output the signal D2b.

According to the operation of the flip-flop FF3, the signal D3 may have logic value high of the signal D1 sampled by the rising edge of the signal D2b. For example, at a time point t14, the flip-flop FF3 may sample the signal D1 in response to the rising edge of the signal D2b. According to the operation of the flip-flop FF4, the signal D4 may have logic value low of the signal D2 sampled by the rising edge of the signal D1b. For example, at a time point t15, the flip-flop FF4 may sample the logic value low of the signal D2 in response to the rising edge of the signal D1b.

The OR operator GT5 may perform a logical sum operation on the logic value of the signal D3 and the logic value of the signal D4. For example, the OR operator GT5 may output a signal ENB having logic value high in response to logic value high of the signal D3 and logic value low of the signal D4.

Figure 11:
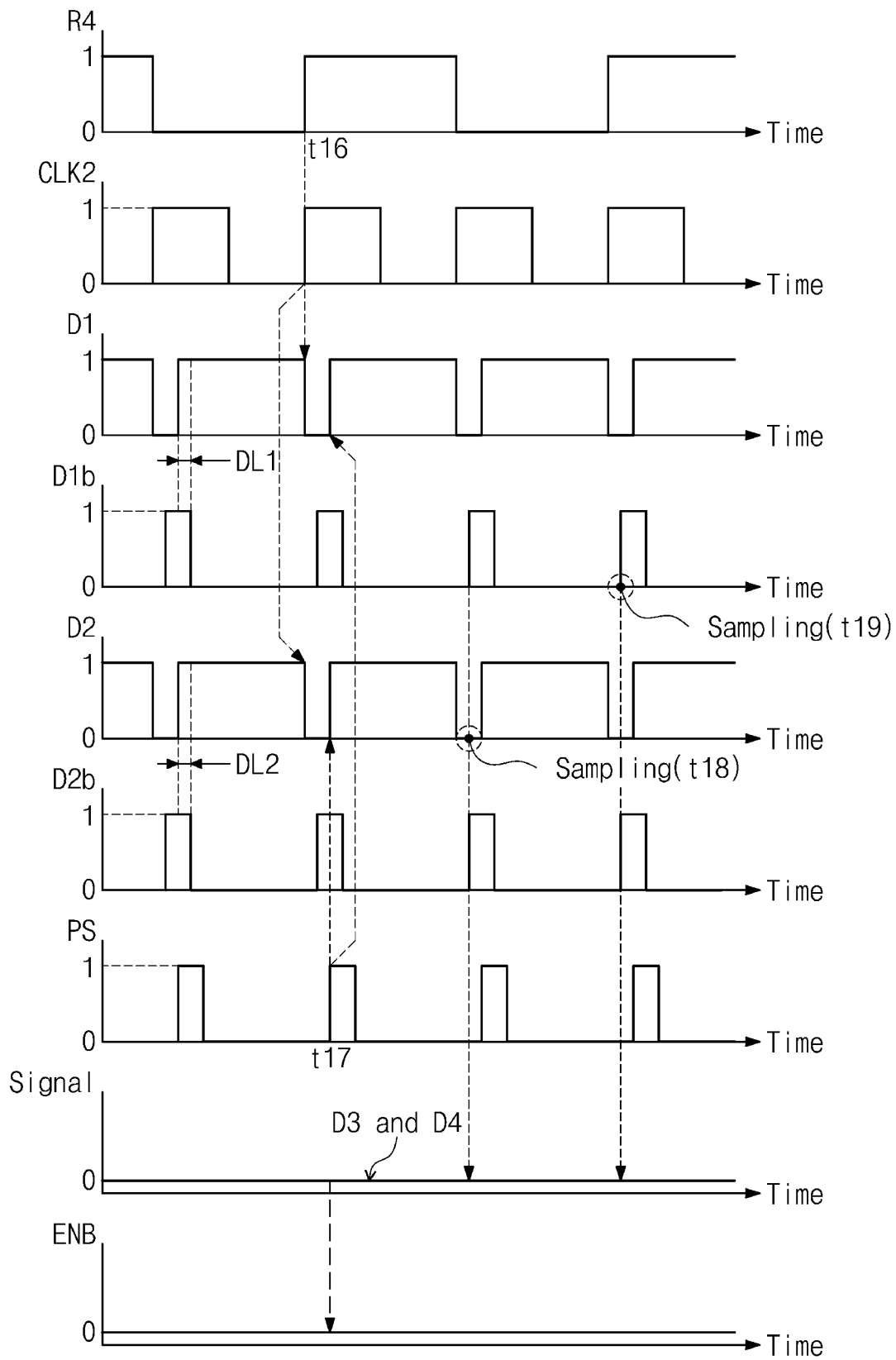
FIGS. 11 and 12 are graphs for describing example operations of a phase detecting circuit of FIG. 9.

FIG. 11 is a diagram for illustrating graphs for describing example operations of a phase detecting circuit of FIG. 9. In an example of FIG. 11, X-axes represent a time, and Y-axes represent logic values of signals R4, D1 to D4, D1b, D2b, PS, and ENB and a clock CLK2. A logic value of "1" represents logic value high, and a logic value of "0" represents logic value low.

Hereinafter, With regard to the case where a time interval between an edge of the signal R4 and the rising edge of the clock CLK2 (for example, a rising edge and a falling edge) is equal to or less than the reference value, example operations of the phase detecting circuit 260_1 will be described with reference to FIGS. 9 and 11. For better understanding, an example in which the rising edge of the signal R4 and the rising edge of the clock CLK2 are received by the flip-flops FF1 and FF2, respectively, at a time point t16 will be described.

According to the operation of the flip-flop FF1, the signal D1 may sequentially and repeatedly have logic value low of the ground voltage sampled by the rising edge of the signal R4 and logic value high preset by the rising edge of signal PS.

For example, at a time point t16, the flip-flop FF1 may sample logic value low of the ground voltage in response to the rising edge of the signal R4. Through a sampling operation performed at the time point t16, the signal D1 may have logic value low in a time interval from the time point t16 to a time point t17. At the time point t17, the flip-flop FF1 may preset the logic value of the signal D1 in response to the rising edge of the signal PS. The preset operation performed at the time point t17 may allow the signal D1 to have logic value high after the time point t17.

According to the operation of the flip-flop FF2, the signal D2 may sequentially and repeatedly have logic value low the ground voltage sampled by the rising edge of the clock CLK2 and logic value high preset by the rising edge of the signal PS.

For example, at the time point t16, the flip-flop FF2 may sample the logic value low of the ground voltage in response to the rising edge of the signal R4. By sampling at the time point t16, the signal D2 may have logic value low in a time interval from the time point t16 to the time point t17. At the time point t17, the flip-flop FF2 may preset a logic value of the signal D2 in response to the rising edge of the signal PS. In response to a preset at the time point t17, the signal D2 may have logic value high after the time point t17.

The signal D1 may be delayed by the delay circuit DL2. For example, the signal D1 may be delayed by a time interval DL1 The signal D1 delayed by the delay circuit DL2 may be inverted by the inverter GT2 to output a signal D1b. The signal D2 may be delayed by the delay circuit DL3. For example, the signal D2 may be delayed by a time interval DL2. The signal D2 delayed by the delay circuit DL3 may be inverted by the inverter GT3 to output a signal D2b.

According to the operation of the flip-flop FF3, a signal D3 may have logic value low of the signal D1 sampled by the rising edge of the signal D2b. For example, at a time point t18, the flip-flop FF3 may sample the signal D1 in response to the rising edge of the signal D2b. According to the operation of the flip-flop FF4, a signal D4 may have logic value low of the signal D2 sampled by the rising edge of the signal D1b. For example, at a time point t19, the flip-flop FF4 may sample the logic value low of the signal D2 in response to the rising edge of the signal D1b.

The OR operator GT5 may perform a logical sum operation on the logic value of the signal D3 and the logic value of the signal D4. For example, the OR operator GT5 may output a signal ENB having logic value low in response to logic value lows of the signals D3 and D4.

Figure 12:
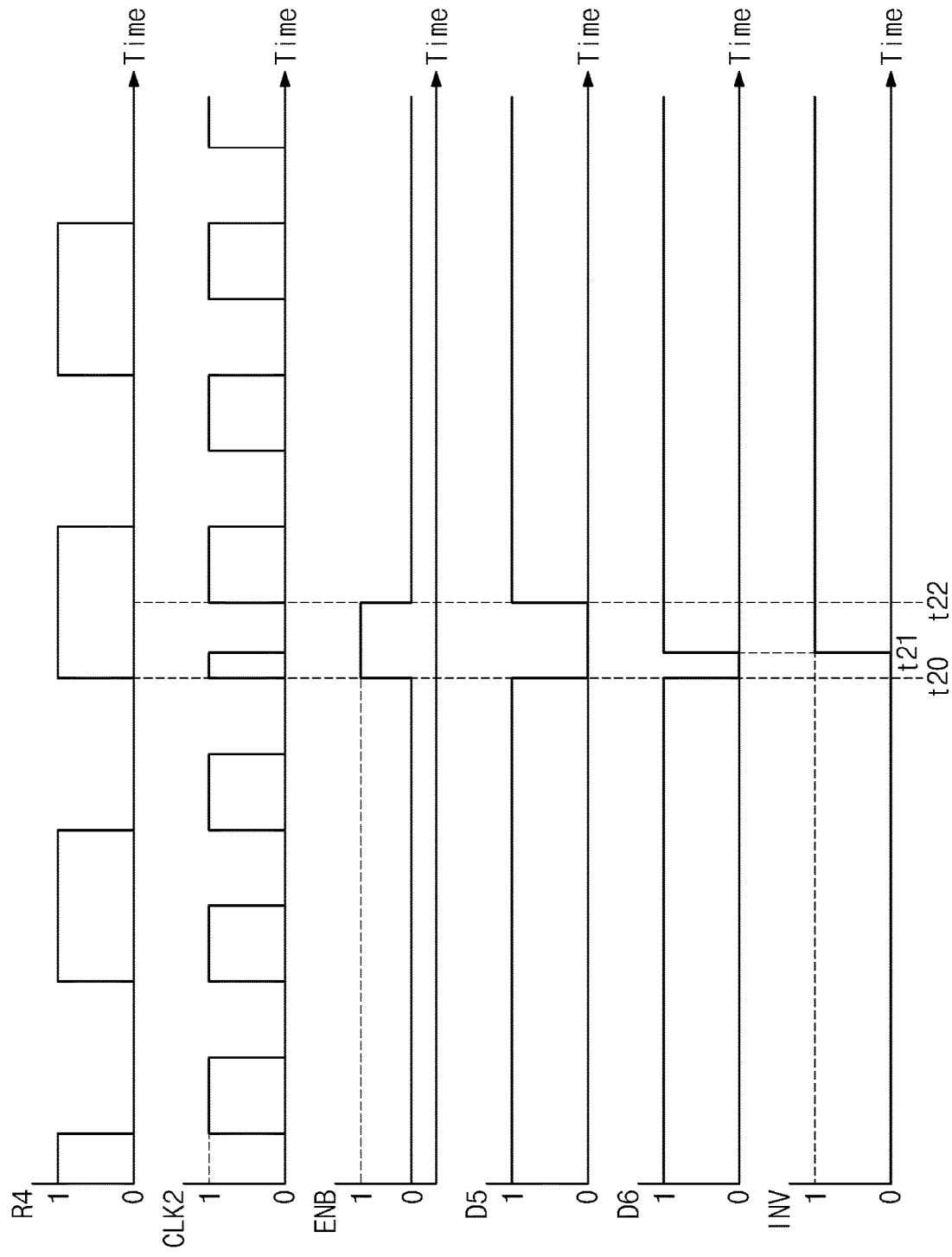

FIG. 12 is a diagram illustrating graphs for describing example operations of a phase detecting circuit of FIG. 9. In graphs of FIG. 12, X-axes represent a time, and Y-axes represent logic values of the signals R4, ENB, D5, D6, and INV and the clock CLK. A logic value of "1" represents logic value high, and a logic value of "0" represents logic value low.

Before a time point t20, a difference between the phase of the signal R4 and the phase of the clock CLK2 may be equal to or less than the reference value. For example, before the time point t20, a time interval between the rising edge of the signal R4 and the rising edge of the clock CLK2 may be equal to or less than the reference value. Accordingly, before the time point t20, the clock data recovery circuit 260_1 may perform the operations described with reference to FIG. 11, and the logic value of the signal ENB may be logic value low.

As described with reference to FIG. 9, the counter CT1 may count pulses included in the clock CLK2 in response to the signal ENB of logic value low. The number of pulses counted by the counter CT1 until the time point t20 may be the reference count. Therefore, after the time point t20, the counter CT1 may output a signal of logic value high to the inverter GT6. After the time point t20, the inverter GT6 may invert the signal received from the counter CT1 to output the signal D5 having logic value low.

The pulse generator PG1 may output a pulse in response to a falling edge of the signal D5 output at the time point t20. In more detail, the pulse generator PG1 may output the signal D6 having a falling edge at the time point t20, logic value low from the time point t20 to a time point t21, and a rising edge at a time point t21.

At the time point t21, the flip-flop FF5 may allow the logic value of the signal INV to transition in response to the rising edge of the signal D6. In an example of FIG. 12, since the signal INV before the time point t21 has logic value low, the signal INV after the time point t21 may have logic value high.

As described with reference to FIG. 3, as the logic value of the signal INV transitions, the phase inverting circuit 250 may invert the phase of the clock CLK2. For example, the phase of the clock CLK2 may be inverted at a time point t22. Therefore, after the time point t21, a difference between the phase of the signal R4 and the phase of the clock CLK2 may be greater than or equal to the reference value. For example, after the time point t21, a time interval between the edge of the signal R4 and the rising edge of the clock CLK2 may be equal to or greater than the reference value.

Therefore, after the time point t22, the clock data recovery circuit 260_1 may perform the operations described with reference to FIG. 10, and the signal ENB may have logic value high. The counter CT1 may stop the counting in response to the signal ENB of logic value high and may output the signal D5 having logic value high.

Figure 13:
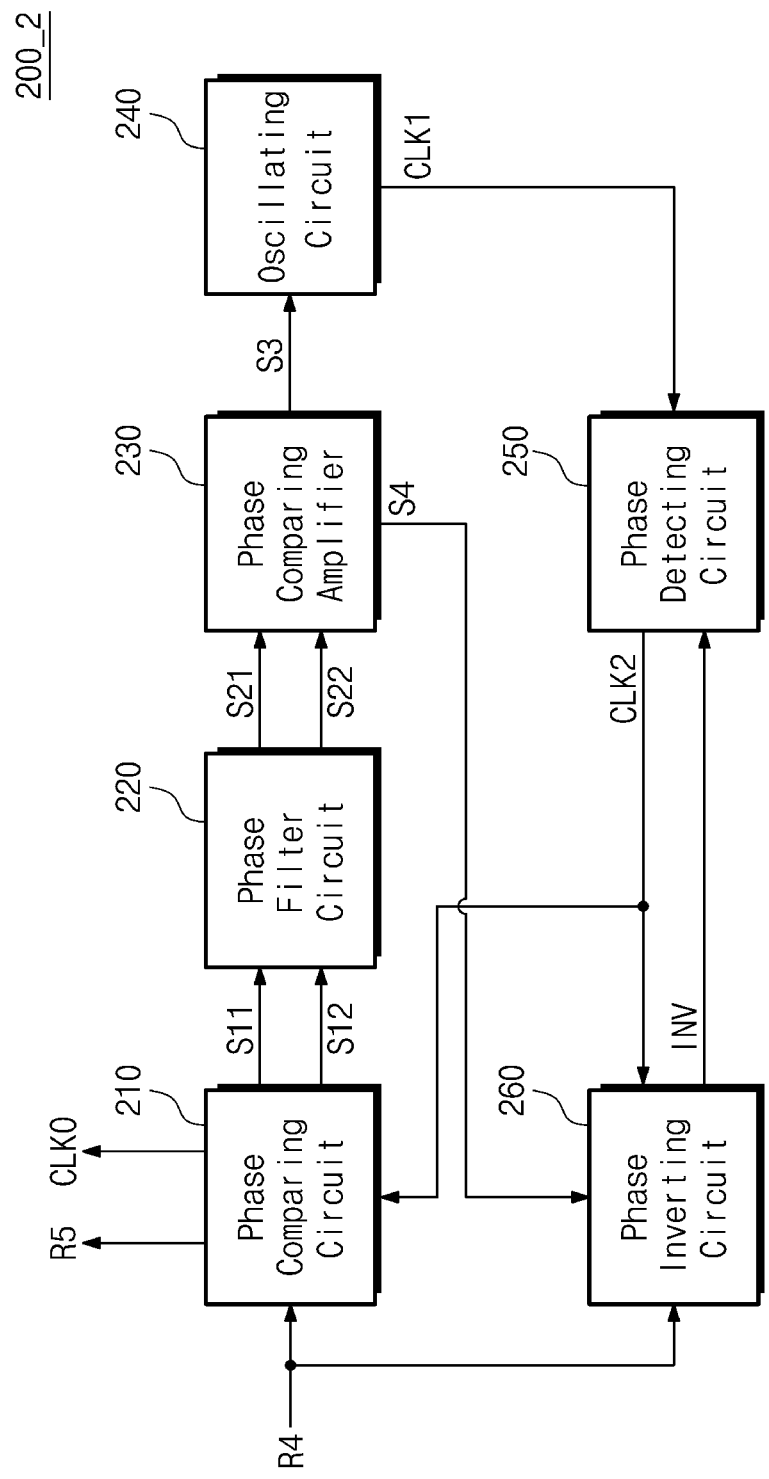
FIG. 13 is a block diagram illustrating an example configuration of a clock data recovery circuit of FIG. 2.

FIG. 13 is a block diagram illustrating an example configuration of a clock data recovery circuit of FIG. 2.

Referring to FIG. 13, a clock data recovery circuit 200_2 includes the phase comparing circuit 210, the phase filter circuit 220, the phase comparing amplifier 230, the oscillating circuit 240, the phase inverting circuit 250, and the phase detecting circuit 260. Example configurations and operations of the phase comparing circuit 210, the phase filter circuit 220, the oscillating circuit 240, and the phase inverting circuit 250 are similar to those described with reference to FIG. 3, and thus, overlapping descriptions thereof will be omitted to avoid redundancy.

Since operations of the phase comparing amplifier 230 for outputting the signal S3 are similar to those described with reference to FIG. 3, additional descriptions will be omitted to avoid redundancy. The phase comparing amplifier 230 may output a signal S4 based on the signals S21 and S22. In more detail, the phase comparing amplifier 230 may output the signal S4 having a level corresponding to a value obtained by subtracting the level of the signal S22 from the level of the signal S21.

As described with reference to FIG. 6, the level of the signal S21 may be associated with a difference between the phase of the signal R4 and the phase of the clock CLK2. Accordingly, the phase comparing amplifier 230 may output the signal S4 having a level that is associated with the difference between the phase of the signal R4 and the phase of the clock CLK2, to the phase detecting circuit 260.

For example, when the difference between the phase of the signal R4 and the phase of the clock CLK2 is equal to or less than the reference value, the level of the signal R4 may be greater than a first level and may be less than a second level. When the phase of the signal R4 is more advanced than the phase of the clock CLK2 (refer to FIG. 6) and the difference between the phase of the signal R4 and the phase of the clock CLK2 is greater than the reference value, the level of the signal S4 may be greater than the second level. When the phase of the signal R4 is more delayed than the phase of the clock CLK2 (refer to FIG. 7) and the difference between the phase of the signal R4 and the phase of the clock CLK2 is greater than the reference value, the level of the signal S4 may be greater than the second level.

The phase detecting circuit 260 may receive the signal S4 from the phase comparing amplifier 230. The phase detecting circuit 260 may output a signal INV for controlling the phase inverting circuit 250 based on the signal S4 and the clock CLK2. Example configurations and operations of the phase detecting circuit 260 will be described with reference to FIGS. 14 to 17.

Figure 14:
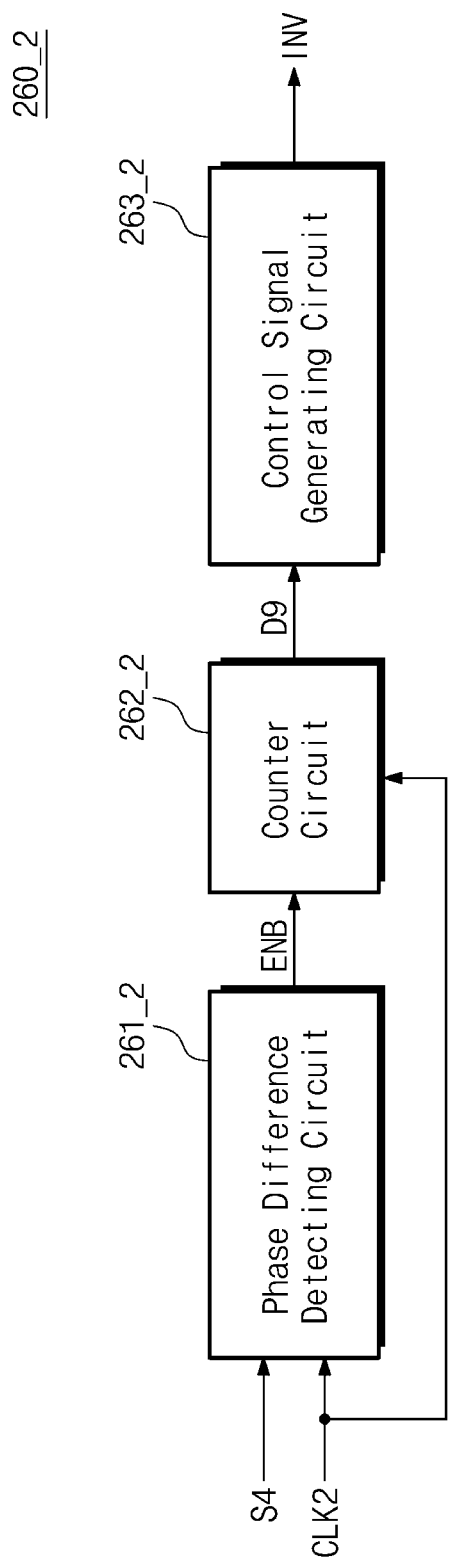
FIG. 14 is a block diagram illustrating an example configuration of a phase detecting circuit of FIG. 13.

FIG. 14 is a block diagram illustrating an example configuration of a phase detecting circuit of FIG. 13.

Referring to FIG. 14, a phase detecting circuit 260_2 may include a phase difference detecting circuit 261_2, a counter circuit 262_2, and a control signal generating circuit 263_2.

The phase difference detecting circuit 261_2 may receive the signal S4 from the phase comparing amplifier 230 of FIG. 13 and may receive the clock CLK2 from the phase inverting circuit 250. The phase difference detecting circuit 261_2 may output a signal ENB for controlling the counter circuit 262_2 based on the signal S4 and the clock CLK2.

As described with reference to FIG. 13, the level of the signal S4 may be associated with the difference between the phase of the signal R4 and the phase of the clock CLK2. The phase difference detecting circuit 261_2 may output the signal ENB based on the voltage of the first level, the voltage of the second level, and the signal S4. For example, the phase difference detecting circuit 261_2 may output the signal ENB having a logic value that is determined according to whether the level of the signal S4 is less than the first level, the first level or greater and the second level or less, and greater than the second level. Although an example is illustrated in FIG. 14 as the signal ENB is one signal, the signal ENB may be modified and changed to include two or more signals.

The counter circuit 262_2 may receive the signal ENB from the phase difference detecting circuit 261_2. For example, the counter circuit 262_2 may count the pulses included in the clock CLK2 in response to the signal ENB of logic value low. When the number of counted pulses exceeds the number (hereinafter referred to as a "reference count") corresponding to the reference time, the counter circuit 262_2 may output a signal D9 having logic value low. The counter circuit 262_2 may output the signal D9 having logic value high in response to the signal ENB of logic value high.

Since detailed configurations and operations of the control signal generating circuit 263_2 are similar to those described with reference to the control signal generating circuit 263_1 in FIG. 8, additional descriptions thereof will be omitted to avoid redundancy.

Figure 15:
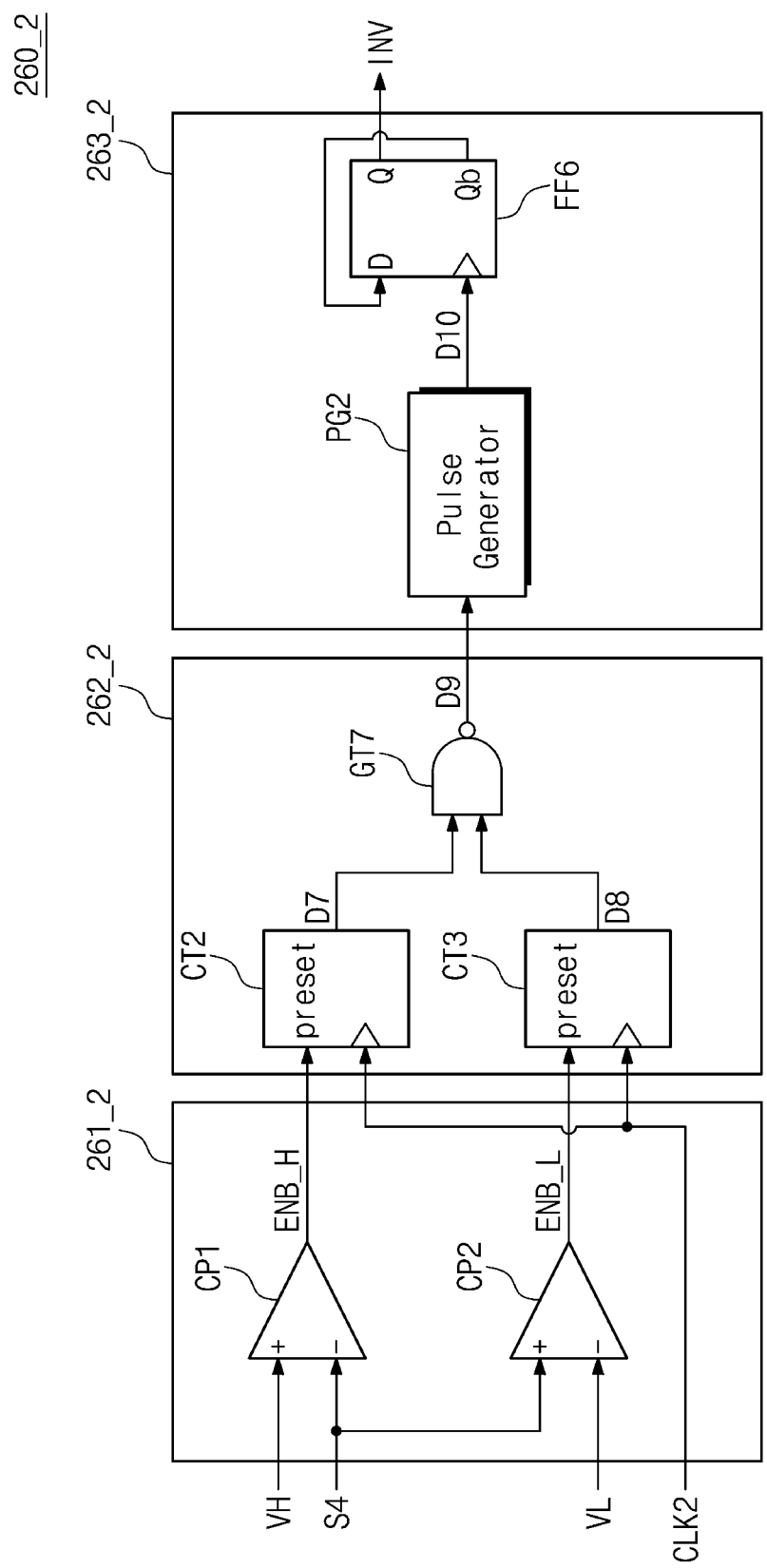
FIG. 15 is a circuit diagram illustrating an example configuration of a phase detecting circuit of FIG. 14.

FIG. 15 is a circuit diagram illustrating an example configuration of a phase detecting circuit of FIG. 14.

Referring to FIG. 15, the phase difference detecting circuit 261_2 may include comparators CP1 and CP2. The counter circuit 262_2 may include counters CT2 and CT3 and a NAND operator GT7. The control signal generating circuit 263_2 may include a pulse generator PG2 and a flip-flop FF6. The signal ENB in FIG. 14 may include signals ENB_H and ENB_L in FIG. 15. Operations of the counters CT2 and CT3, the pulse generator PG2, and the flip-flop FF6 are similar to the operations described with reference to the counter CT1, the pulse generator PG1, and the flip-flop FF5 in FIG. 9, and thus, additional descriptions will be omitted to avoid redundancy.

The comparators CP1 and CP2 may receive voltages VH and VL from a voltage generator included in or outside the clock data recovery circuit 200_2. The comparator CP2 may receive the signal S4 through a non-inverting terminal and may receive the voltage VL of the first level through an inverting terminal. The comparator CP1 may receive the voltage VH of the second level through a non-inverting terminal and may receive the signal S4 through an inverting terminal.

Each of the comparators CP1 and CP2 may compare the level of the signal received through the non-inverting terminal with the level of the signal received through the inverting terminal. When the level of the signal received through the non-inverting terminal is greater than the level of the signal received through the inverting terminal, the comparators CP1 and CP2 may output a signal ENB_H having logic value high and a signal ENB_L having logic value high, respectively. When the level of the signal received through the non-inverting terminal is equal to or less than the level of the signal received through the inverting terminal, the comparators CP1 and CP2 may output the signal ENB_H having logic value low and the signal ENB_L having logic value low, respectively.

In response to signals D7 and D8 having logic value low, the NAND operator GT7 may output a signal D9 having logic value high. In response to the signals D7 and D8 having different logic values, the NAND operator GT7 may output the signal D9 having logic value high. In response to the signals D7 and D8 having logic value high, the NAND operator GT7 may output the signal D9 having logic value low. Example operations of the phase detecting circuit 260_2 according to the difference between the phase of the signal R4 and the phase of the clock CLK2 will be described with reference to FIGS. 16 and 17.

Figure 16:
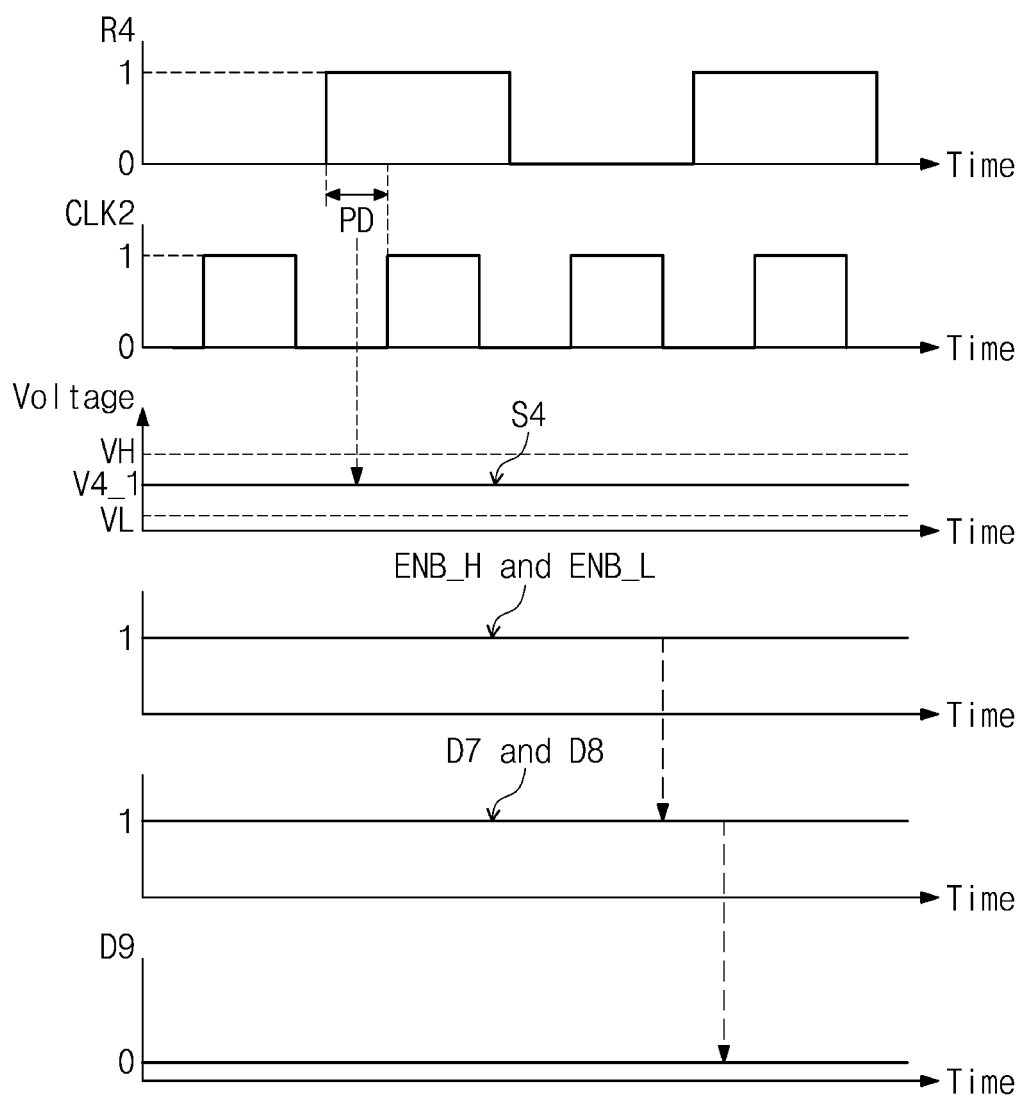
FIG. 16 and FIG. 17 are graphs for describing example operations of a phase detecting circuit of FIG. 15.

FIG. 16 is a diagram illustrating graphs for describing example operations of a phase detecting circuit of FIG. 15.

The difference between the phase of the signal R4 and the phase of the clock CLK2 may be equal to or greater than the reference value. For example, a time interval PD between the rising edge of the signal R4 and the rising edge of the clock CLK2 may be greater than the reference value.

As above described with reference to FIG. 13, a level V4_1 of the signal S4 output from the phase comparing amplifier 230 may be equal to or higher than the first level of the voltage VL and may be equal to or lower than the second level of the voltage VH. Since the level of the signal S4 is equal to or less than the second level, the comparator CP1 may output the signal ENB_H having logic value high. Since the level of the signal S4 is equal to or higher than the first level, the comparator CP2 may output the signal ENB_L having logic value high.

The counter CT2 may be preset in response to the signal ENB_H of logic value high. By the preset operation, the counter CT2 may output the signal D7 having logic value high. The counter CT3 may be preset in response to the signal ENB_L of logic value high. By the preset operation, the counter CT3 may output the signal D8 having logic value high. The NAND operator GT7 may output the signal D9 having logic value low in response to the signals D7 and D8 having logic value high.

Thereafter, as above described with reference to FIG. 12, the pulse generator PG2 may output the signal D10 that does not include a pulse in response to the signal D9 of logic value low. The flip-flop FF6 may output the signal INV having a level maintained uniformly.

Figure 17:
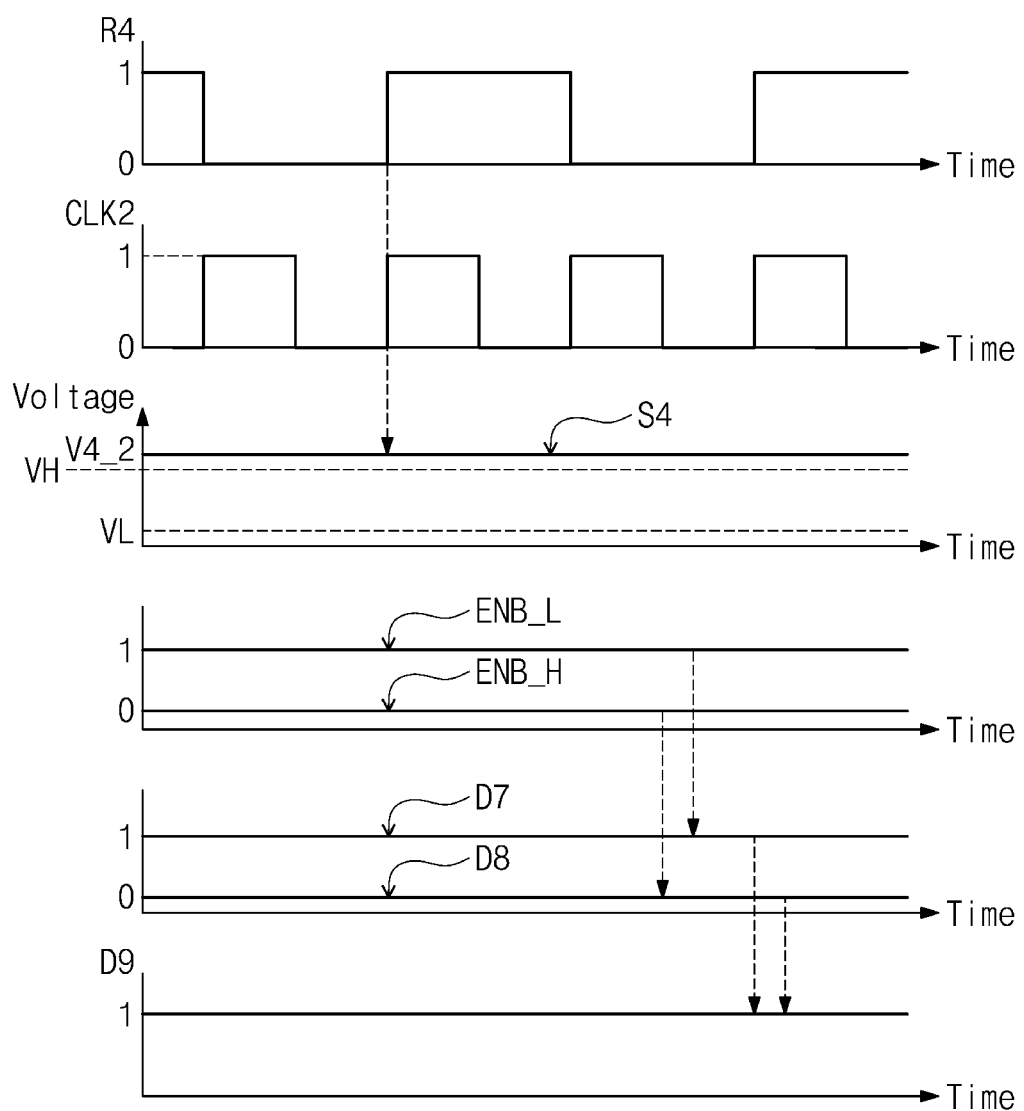

FIG. 17 is a diagram illustrating graphs for describing example operations of a phase detecting circuit of FIG. 15.

The rising edge of the signal R4 and the rising edge of the clock CLK2 may be substantially simultaneously received by the phase detecting circuit 260_2. In FIG. 17, the term "substantially simultaneously" may mean not only "completely simultaneously" but also "with a minute time difference". For example, the rising edge of the signal R4 in FIG. 17 may be received finely earlier than the rising edge of the clock CLK2.

As above described with reference to FIG. 13, a level V4_2 of the signal S4 output from the phase comparing amplifier 230 may be greater than the second level of the voltage VH. Since the level of the signal S4 is greater than the second level, the comparator CP1 may output the signal ENB_H having logic value low. Since the level of the signal S4 is greater than the second level that is greater than the first level, the comparator CP2 may output the signal ENB_L having logic value high.

The counter CT2 may count the pulses included in the clock CLK2 in response to the signal ENB_H of logic value low. When the number of counted pulses exceeds the reference count, the counter CT2 may output the signal D7 having logic value low. The counter CT3 may be preset in response to the signal ENB_L of logic value high. By the preset operation, the counter CT3 may output the signal D8 having logic value high. The NAND operator GT7 may output the signal D9 having logic value high in response to the signal D7 having logic value low and the signal D8 having logic value high.

The pulse generator PG2 may output the signal D10 including a pulse to the flip-flop FF6 in response to the signal D9 having logic value high. The flip-flop FF6 may allow the logic value of the signal INV to transition in response to the pulse included in the signal D10.

When the rising edge of the signal R4 is more advanced than the rising edge of the clock CLK2 and the time interval between the rising edge of the signal R4 and the rising edge of the clock CLK2 is less than the reference value, the phase detecting circuit 260_2 may perform operations similar to those described with reference to FIG. 17.

When the rising edge of the signal R4 is more delayed than the rising edge of the clock CLK2 and the time interval between the rising edge of the signal R4 and the rising edge of the clock CLK2 is less than the reference value, the level of the signal S4 may be lower than the first level of a voltage VL. Accordingly, the operations of the comparator CP2 and the counter CT3 may be similar to those of the comparator CP1 and the counter CT2 described with reference to FIG. 17. As in the above description given with reference to FIG. 17, the NAND operator GT7 may output the signal D9 of logic value low.

According to embodiments of the inventive concept, a difference between a phase of the input signal and a phase of the clock may be efficiently and quickly adjusted.

The contents described above are specific embodiments for implementing the inventive concept. The inventive concept may include not only the embodiments described above but also embodiments in which a design is simply or easily capable of being changed. In addition, the inventive concept may also include technologies easily changed to be implemented using embodiments. While the inventive concept has been described with reference to example embodiments thereof, it will be apparent to those of ordinary skill in the art that various changes and modifications may be made thereto without departing from the spirit and scope of the present disclosure. Therefore, the scope of the present disclosure is not limited to the described embodiments but is defined by the claims and their equivalents.

What is claimed is:
1. An electronic circuit comprising:
an oscillating circuit configured to generate a first clock to be used to sample an input signal;
a phase inverting circuit configured to output a second clock based on the first clock; and
a phase detecting circuit configured to:
generate a control signal having a first logic value, when a phase difference, between a phase of the input signal and a phase of the second clock, is less than a reference value for a time not shorter than a reference time, and
generate the control signal having a second logic value, when the phase difference is not less than the reference value, or when the phase difference is less than the reference value for a time shorter than the reference time, and
wherein the phase inverting circuit is further configured to invert the phase of the second clock, in a case where a logic value of the control signal changes from the first logic value to the second logic value, or in a case where the logic value of the control signal changes from the second logic value to the first logic value.

2. The electronic circuit of claim 1, wherein the phase detecting circuit is further configured to count a number of pulses included in the second clock.

3. The electronic circuit of claim 2, wherein the phase detecting circuit is further configured to output the control signal having the first logic value, when pulses, a number of which is not less than a reference count, are counted by the phase detecting circuit, the reference count corresponding to the reference time.

4. The electronic circuit of claim 1, wherein the oscillating circuit is further configured to adjust a phase of the first clock based on the phase difference.

5. The electronic circuit of claim 1, further comprising:
a phase comparing circuit configured to generate a first signal associated with the phase difference; and
a filter circuit configured to pass a second signal having a level associated with the phase difference, based on the first signal.

6. The electronic circuit of claim 5, wherein the phase comparing circuit is configured to provide a digital receiving circuit with the second clock and the input signal sampled based on the second clock.

7. The electronic circuit of claim 5, wherein the oscillating circuit is further configured to generate the first clock, based on a voltage having a frequency adjusted based on the second signal.

8. An electronic circuit comprising:
an oscillating circuit configured to generate a first clock to be used to sample an input signal;
an amplifying circuit configured to generate a control voltage having a level corresponding to a phase difference between a phase of the input signal and a phase of the first clock;
a phase inverting circuit configured to output a second clock based on the first clock; and
a phase detecting circuit configured to:
output a control signal to control the phase inverting circuit, and
allow a logic value of the control signal to transition, when the level of the control voltage is lower than a first level, or higher than a second level for a reference time or more, and
wherein the first level is lower than the second level, and
wherein the phase inverting circuit is further configured to invert the phase of the second clock when the logic value of the control signal transitions.

9. The electronic circuit of claim 8, wherein the phase detecting circuit is further configured to maintain the logic value of the control signal, when the level of the control voltage is lower than the first level or higher than the second level for a time shorter than the reference time.

10. The electronic circuit of claim 8, wherein the phase detecting circuit is further configured to maintain the logic value of the control signal, when the level of the control voltage is not less than the first level and not greater than the second level.

11. The electronic circuit of claim 8, wherein the phase detecting circuit is further configured to compare the level of the control voltage with the first level, and compare the level of the control voltage with the second level.

12. The electronic circuit of claim 8, wherein the phase detecting circuit is further configured to count a number of pulses included in the second clock, when the level of the control voltage is lower than the first level or higher than the second level.

13. The electronic circuit of claim 12, wherein the phase detecting circuit is further configured to allow the logic value of the control signal to transition when the number of the counted pulses is not less than a reference count, the reference count corresponding to the reference time.

14. An electronic circuit comprising:
    an oscillating circuit configured to generate a first clock to be used to sample an input signal;
    a phase inverting circuit configured to output a second clock based on the first clock; and
    a phase detecting circuit configured to allow a logic value of a control signal to transition, when a number of pulses included in the second clock, the second clock being received from the phase inverting circuit, is not less than a reference count during an time interval in which a phase difference between a phase of the input signal and a phase of the first clock is less than a reference value, and
    wherein the phase inverting circuit is further configured to invert the phase of the second clock when the logic value of the control signal transitions.

15. The electronic circuit of claim 14, wherein the phase detecting circuit comprises:
    a first flip-flop configured to output a first signal having a first logic value in response to a rising edge and a falling edge of the input signal; and
    a second flip-flop configured to output a second signal having the first logic value in response to a rising edge of the second clock.

16. The electronic circuit of claim 15, wherein the phase detecting circuit further comprises:
    a third flip-flop configured to sample the first signal based on the second signal to output a third signal; and
    a fourth flip-flop configured to sample the second signal based on the first signal to output a fourth signal by sampling.

17. The electronic circuit of claim 16, further comprising:
    a counter configured to count the number of the pulses included in the second clock based on a logic operation, the logic operation being for the third signal and a logic value of the fourth signal.

* * * * *